United States Patent
Tanzawa

(10) Patent No.: US 7,005,936 B2
(45) Date of Patent: Feb. 28, 2006

(54) DIRECT FREQUENCY MODULATION APPARATUS WHICH MODULATES FREQUENCY BY APPLYING DATA-DEPENDENT VOLTAGE TO CONTROL TERMINAL OF VOLTAGE-CONTROLLED OSCILLATOR WITHOUT MEDIACY OF PLL, AND COMMUNICATION SYSTEM

(75) Inventor: Toru Tanzawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 109 days.

(21) Appl. No.: 10/716,514

(22) Filed: Nov. 20, 2003

(65) Prior Publication Data

US 2005/0052250 A1   Mar. 10, 2005

(30) Foreign Application Priority Data

Sep. 9, 2003   (JP) ............................ 2003-317261

(51) Int. Cl.
  H03B 5/08   (2006.01)
  H03B 5/12   (2006.01)
  H03C 3/00   (2006.01)
  H03C 3/20   (2006.01)
  H03L 7/099  (2006.01)

(52) U.S. Cl. .................. 331/176; 331/17; 331/36 C; 331/177 V; 332/127

(58) Field of Classification Search ............ 331/10, 331/11, 16, 17, 25, 36 C, 176, 177 V, 179; 332/127; 375/303–307, 376; 455/42, 75–77, 455/110, 113, 120, 126, 260
See application file for complete search history.

(56) References Cited

U.S. PATENT DOCUMENTS 6,674,333 B1 *   1/2004   Peckham et al. ......... 331/36 C

OTHER PUBLICATIONS

Aruna Ajjikuttira, et al., "A Fully-Integrated CMOS RFIC for Bluetooth Application", 2001 IEEE International Solid-State Circuits Conference Digest, Feb. 2001, pp. 198-199.
Masaru Kokubo, et al., "A 2.4GHz RF Transceiver with Digital Channel-Selection Filter for Bluetooth", 2002 IEEE International Solid State Circuit Conference Digest, Feb. 2002, 3 pgs.

* cited by examiner

Primary Examiner—David Mis
(74) Attorney, Agent, or Firm—Oblon, Spivak, McClelland, Maier & Neustadt, P.C.

(57) ABSTRACT

A direct frequency modulation apparatus modulates frequency by applying a transmission data-dependent voltage to the control terminal of a voltage-controlled oscillator without the mediacy of a phased-locked loop. The direct frequency modulation apparatus is set such that the temperature dependencies of a terminal voltage in PLL locking and a modulation voltage in an open state correspond to that of a varicap diode.

16 Claims, 22 Drawing Sheets

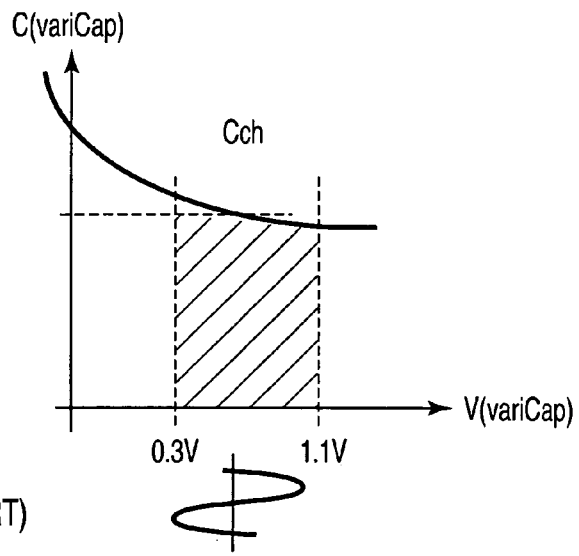
FIG. 5 (PRIOR ART)
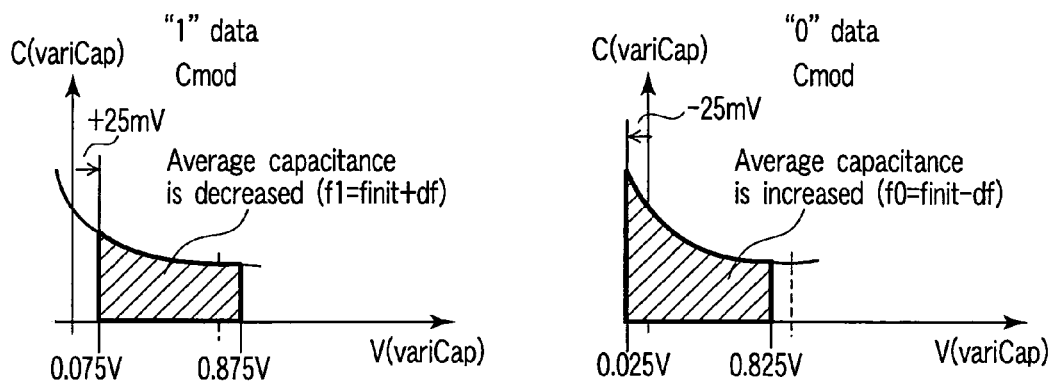
FIG. 6A (PRIOR ART)
FIG. 6B (PRIOR ART)
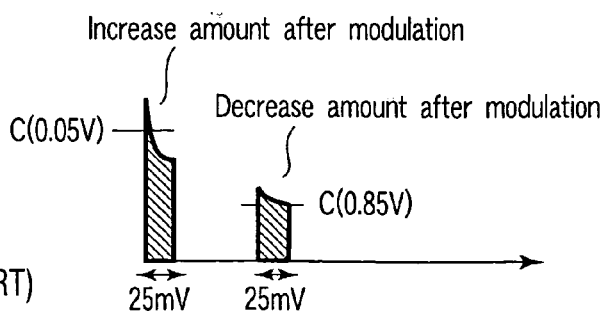
FIG. 6C (PRIOR ART)

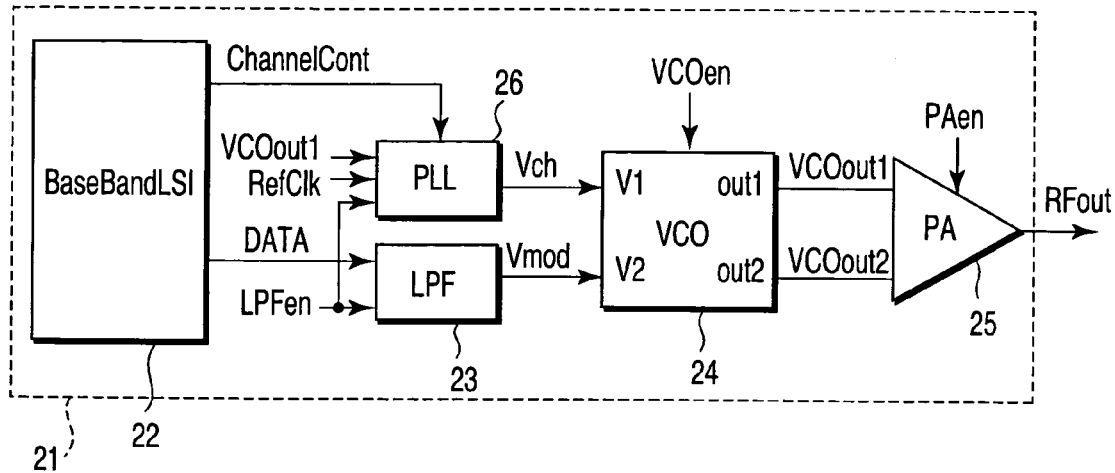
F I G. 11
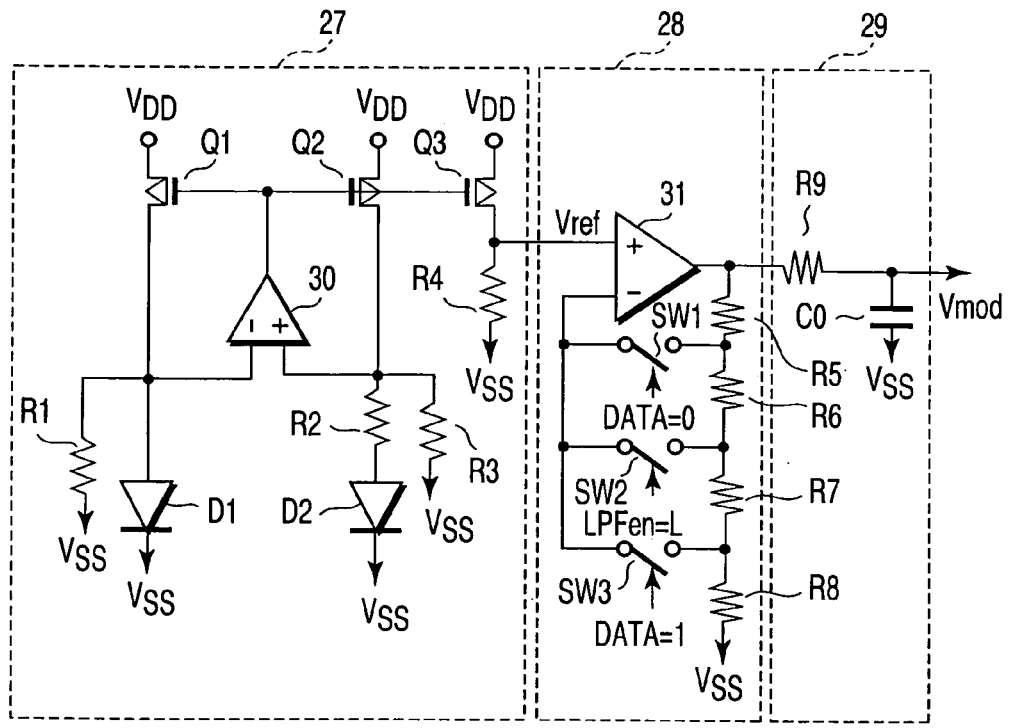
F I G. 12

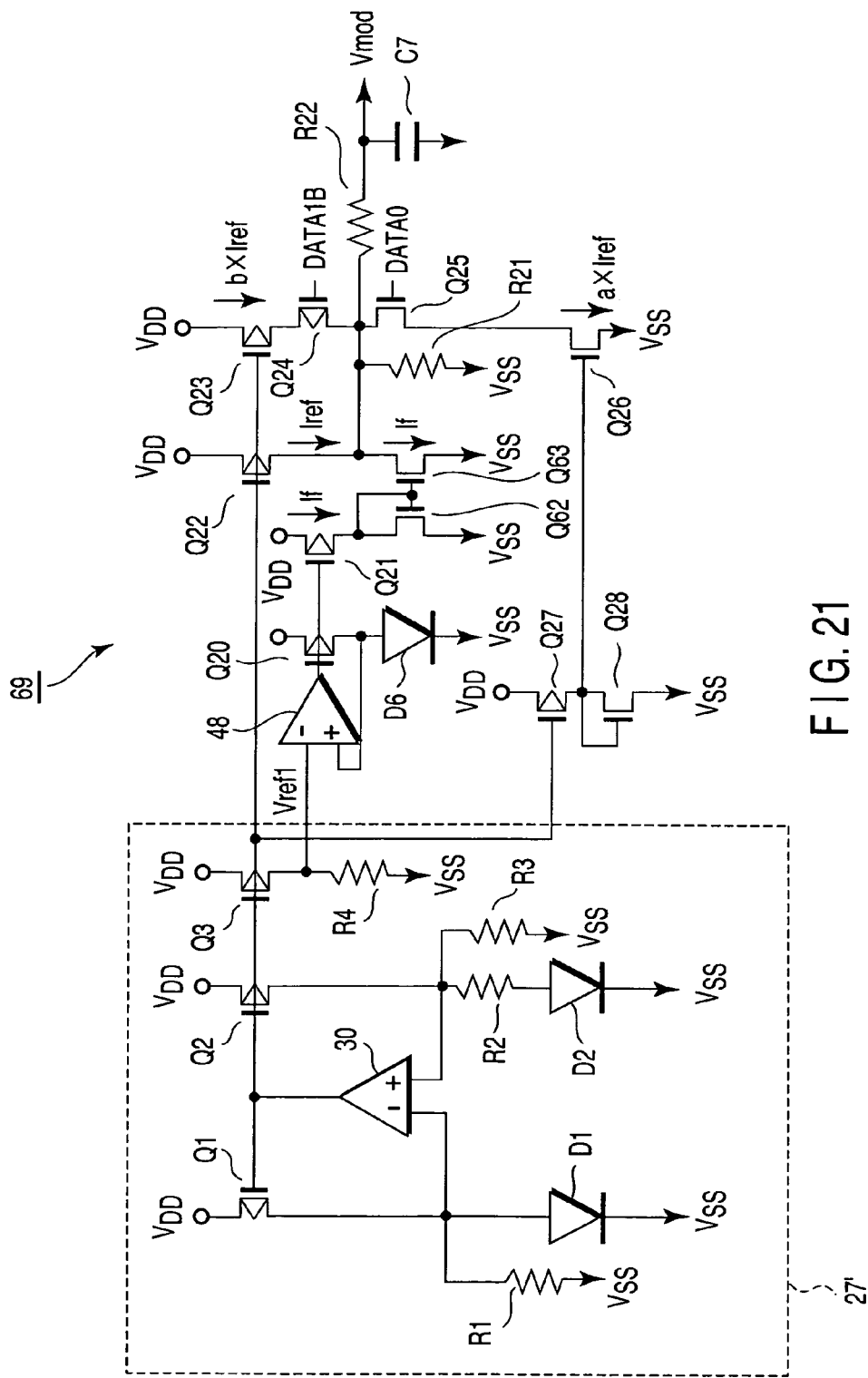
F I G. 21

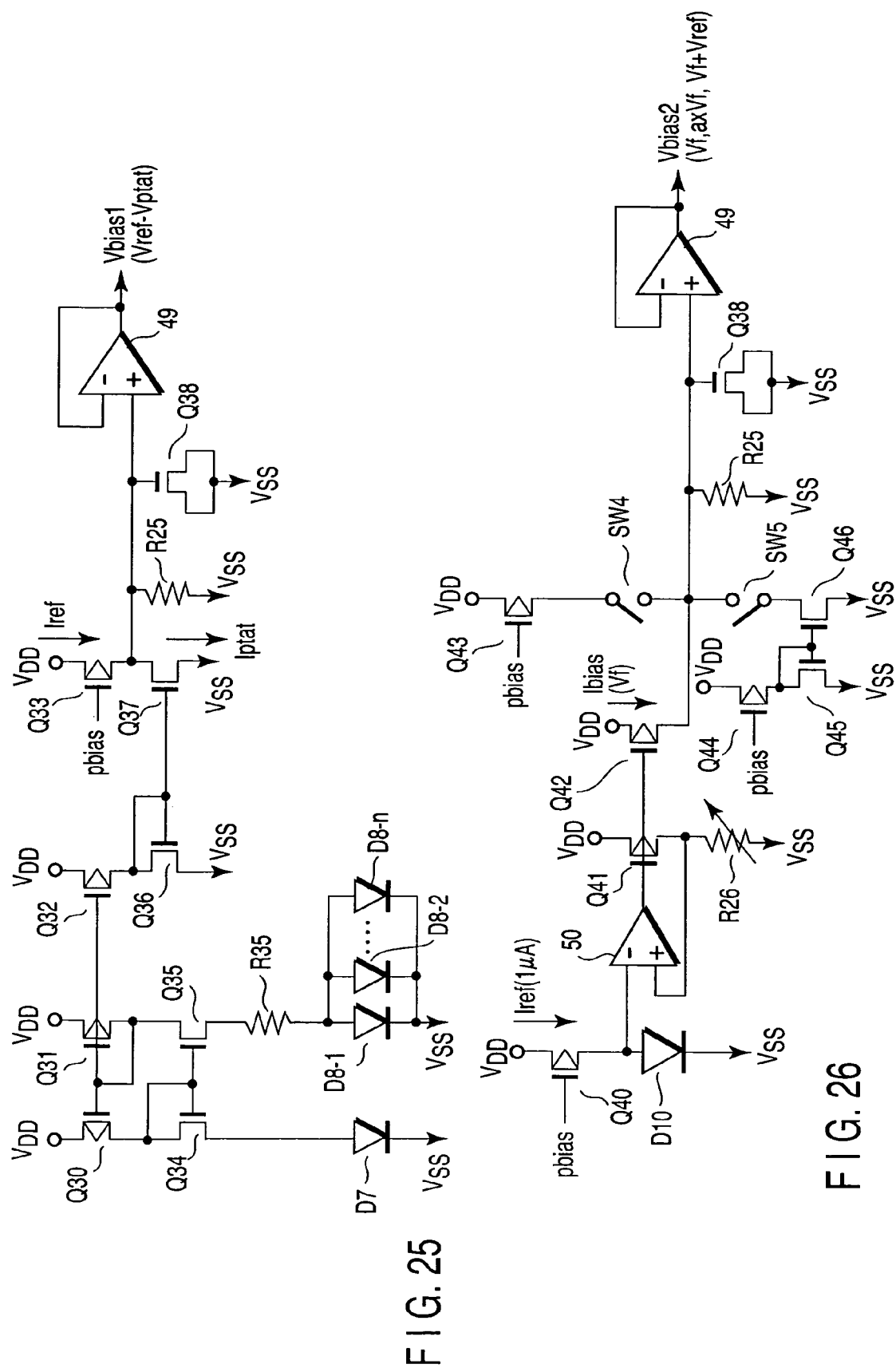
F I G. 25
F I G. 26

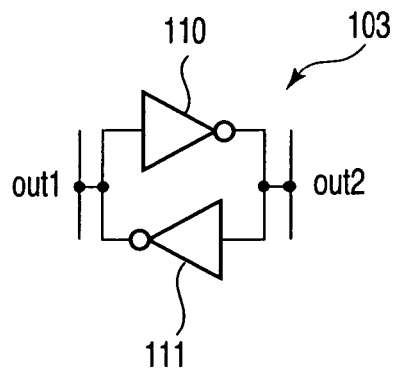
F I G. 34A
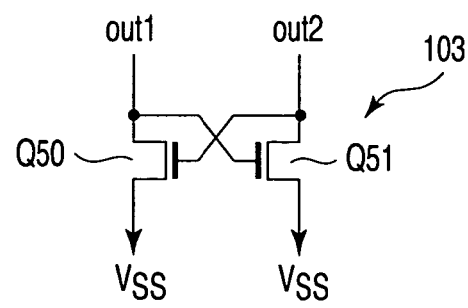
F I G. 34B
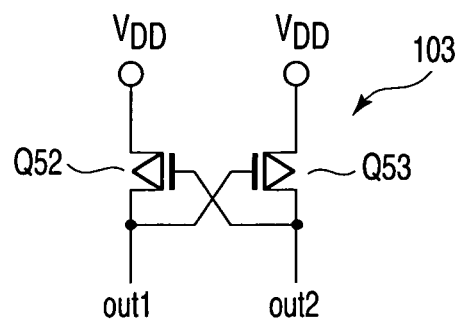
F I G. 34C
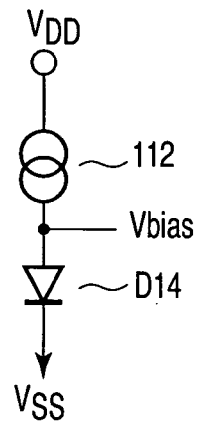
F I G. 35
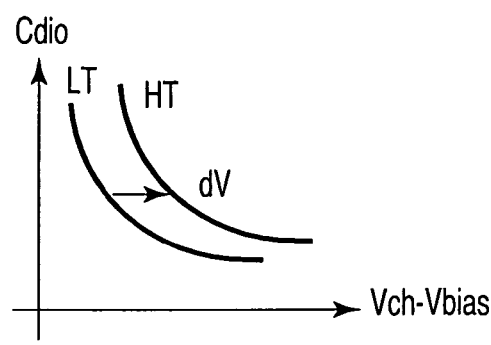
F I G. 36A
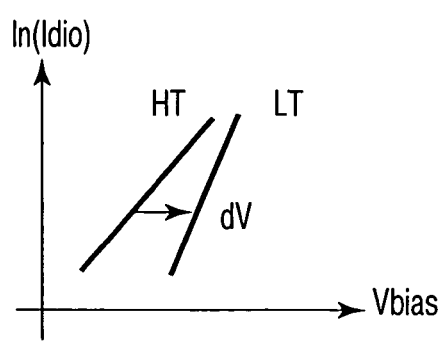
F I G. 36B

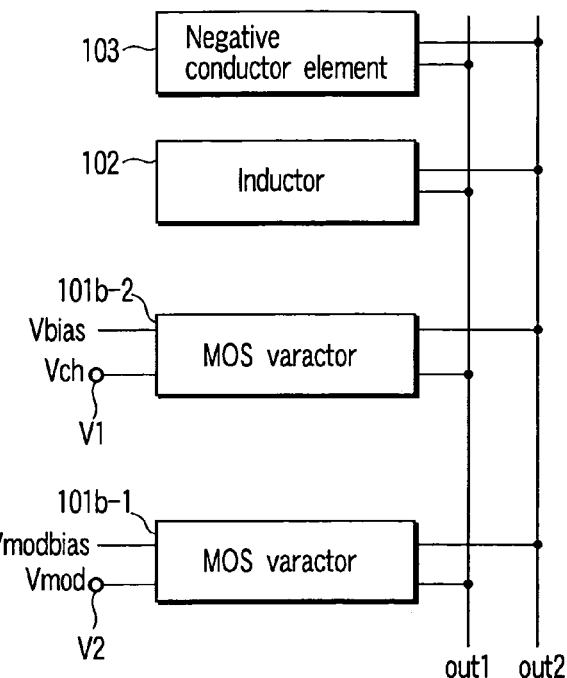
F I G. 37
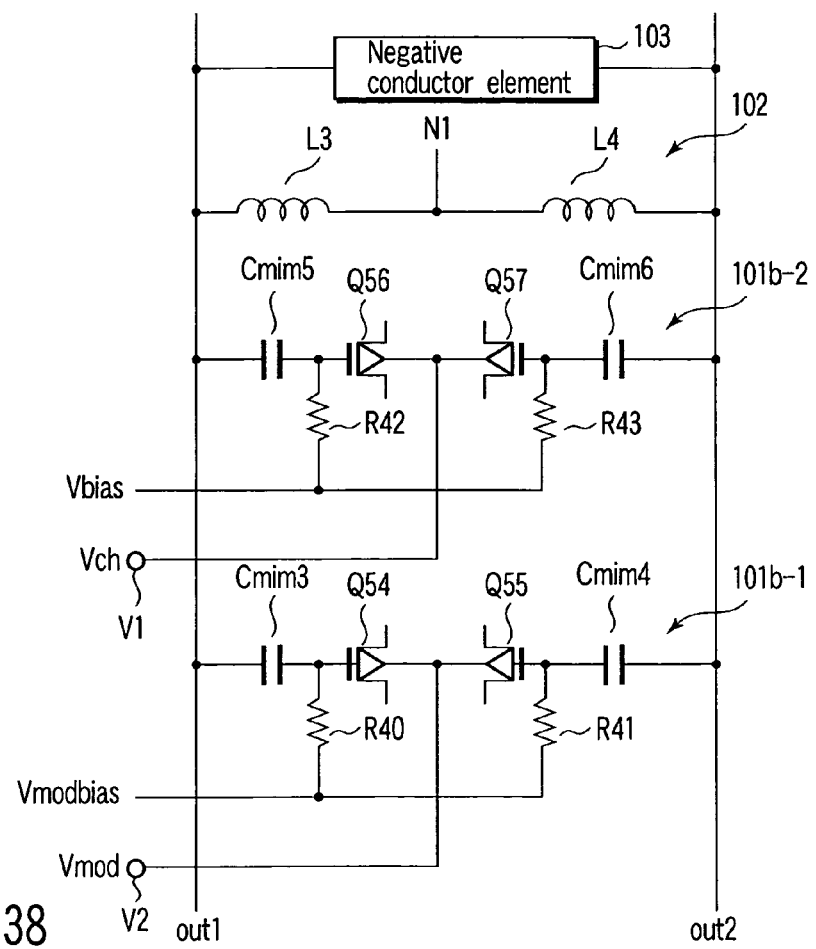
F I G. 38

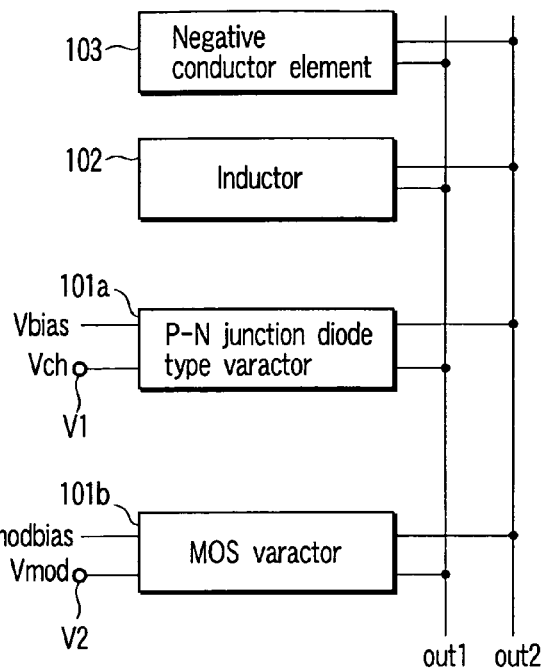
F I G. 42
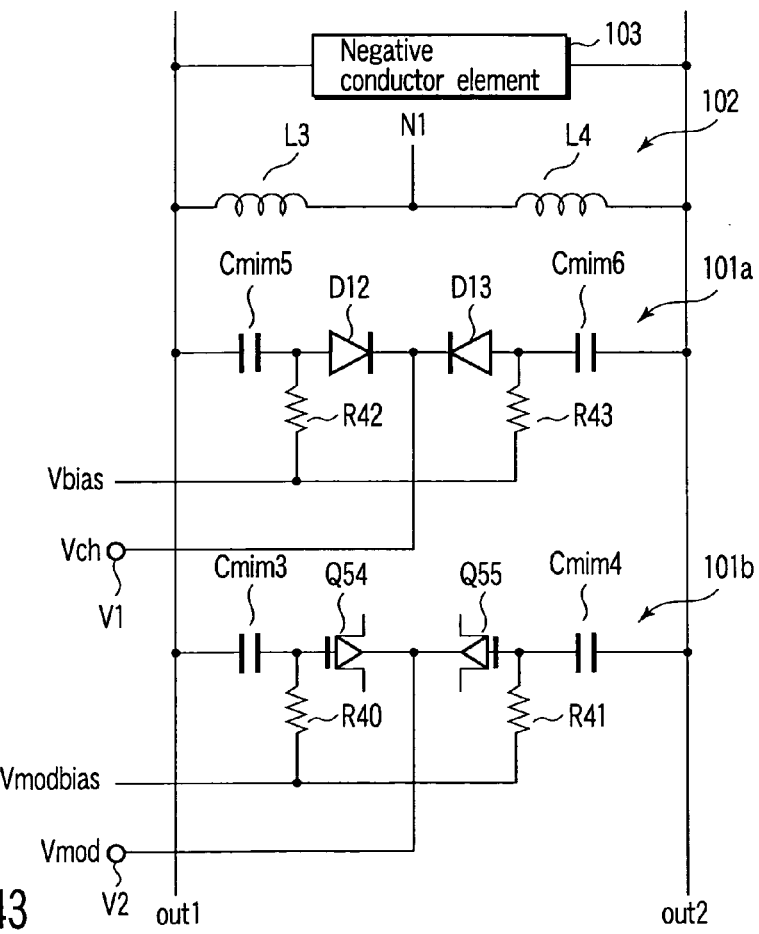
F I G. 43

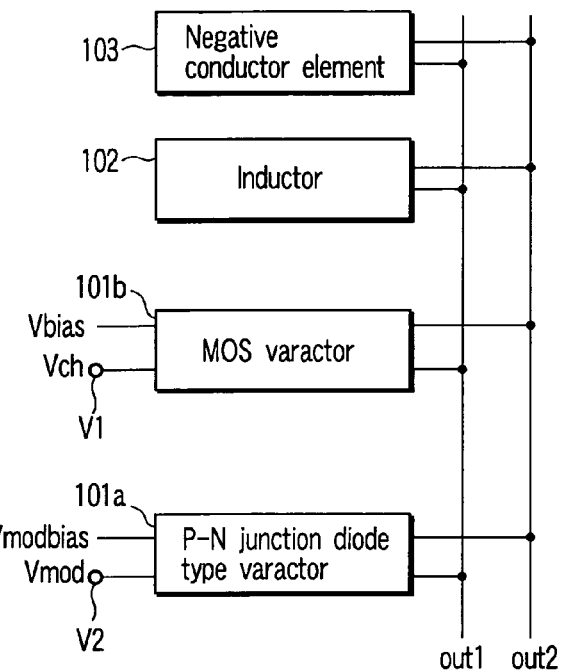
F I G. 44
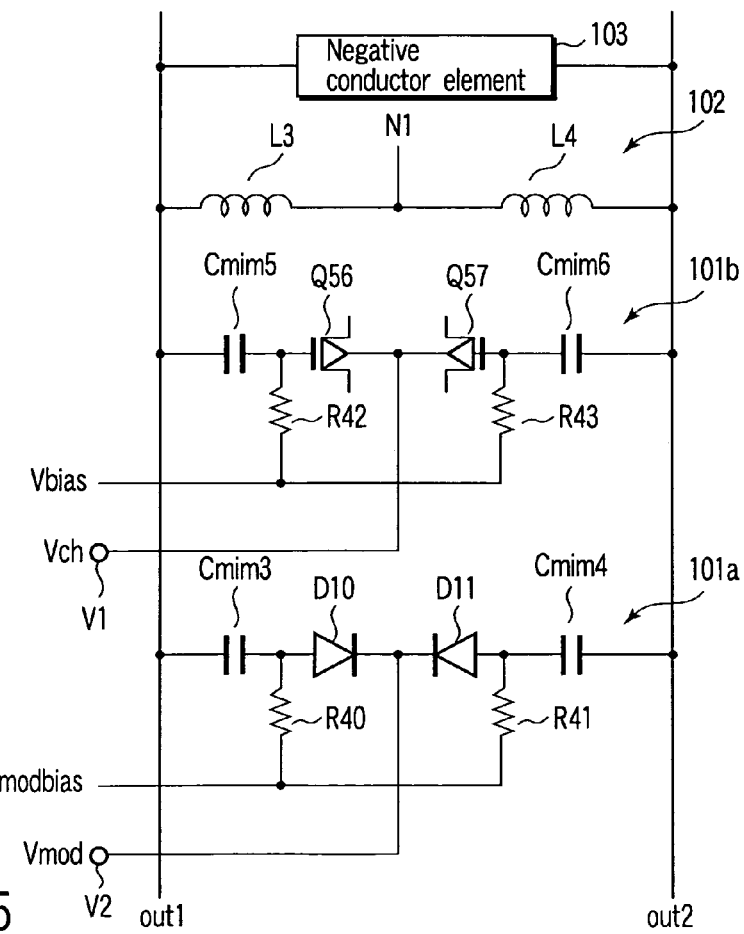
F I G. 45

DIRECT FREQUENCY MODULATION APPARATUS WHICH MODULATES FREQUENCY BY APPLYING DATA-DEPENDENT VOLTAGE TO CONTROL TERMINAL OF VOLTAGE-CONTROLLED OSCILLATOR WITHOUT MEDIACY OF PLL, AND COMMUNICATION SYSTEM

CROSS-REFERENCE TO RELATED APPLICATIONS

This application is based upon and claims the benefit of priority from the prior Japanese Patent Application No. 2003-317261, filed Sep. 9, 2003, the entire contents of which are incorporated herein by reference.

BACKGROUND OF THE INVENTION

1. Field of the Invention

The present invention relates to a direct frequency modulation apparatus which modulates frequency by applying a data-dependent voltage to the control terminal of a voltage-controlled oscillator without the mediacy of a phased-locked loop (PLL), and a communication system having the direct frequency modulation apparatus.

2. Description of the Related Art

One method of communication is the frequency modulation method. According to the frequency modulation method, data are exchanged by, for example, making two different frequencies correspond to data of "1" and "0". FIG. 1 is a block diagram for explaining the schematic arrangement of a conventional direct frequency modulation apparatus. FIG. 1 shows extracted part of a communication system 1 which modulates the frequency by changing a voltage applied to the control terminal of a voltage-controlled oscillator in accordance with data of "1" or "0". Communication systems of this type have been reported in, e.g., A. Ajjikuttira et. al., "A Fully-Integrated CMOS RFIC for Bluetooth Applications", 2001 IEEE International Solid-State Circuits Conference DIGEST OF TECHNICAL PAPERS, February 2001, pp. 198–199, and M. Kokubo et. al., "A 2.4 GHz RF Transceiver with Digital Channel-Selection Filter for Bluetooth", 2002 IEEE International Solid-State Circuits Conference, February 2002, pp. 94–95.

The communication system 1 comprises a baseband LSI (BaseBand LSI) 2, low-pass filter (LPF) 3, voltage-controlled oscillator (VCO) 4, power amplifier (PA) 5, and phase-locked loop (PLL) 6.

The baseband LSI 2 controls each circuit in the system. Transmission data DATA output from the baseband LSI 2 is supplied to the low-pass filter 3, and a signal ChannelCont for designating a frequency channel is supplied to the phase-locked loop 6. A signal LPFen is supplied to the low-pass filter 3 and phase-locked loop 6 to control their activation/inactivation.

A reference clock RefClk and an oscillation signal VCOout1 output from the voltage-controlled oscillator 4 are input to the phase-locked loop 6. The reference clock RefClk is frequency-divided by a frequency channel designated by the signal ChannelCont supplied from the baseband LSI 2. A control voltage (voltage for setting a channel frequency) Vch is so regulated as to lock the phases of the frequency-divided clock and oscillation signal VCOout1, and is applied to one input terminal V1 of the voltage-controlled oscillator 4. During this regulation period, a voltage (Vmod) which hardly depends on the temperature or power supply voltage is applied from the low-pass filter 3 to the other input terminal V2 of the voltage-controlled oscillator 4. Activation/inactivation of the voltage-controlled oscillator 4 is controlled by a signal VCOen, and the voltage-controlled oscillator 4 operates as a frequency modulation circuit together with the low-pass filter 3.

Oscillation signals VCOout1 and VCOout2 output from output terminals out1 and out2 of the voltage-controlled oscillator 4 are supplied to the power amplifier 5 where they are amplified to output a transmission signal RFout. A signal PAen is supplied to the power amplifier 5 to control its activation/inactivation.

FIG. 2 is a timing chart showing the waveform of each signal in the communication system 1 shown in FIG. 1. At time t1, the signal ChannelCont changes, the frequency channel changes from ch21 to ch9, and the signal VCOen changes to the "H" level to activate the voltage-controlled oscillator 4. The voltage-controlled oscillator 4 then outputs an oscillation signal VCOout1 having a frequency finit corresponding to the voltages Vch and Vmod applied to the input terminals V1 and V2. At this time, the low-pass filter 3 is inactive (output of a voltage corresponding to data stops, and the reference voltage Vref is output), and the phase-locked loop 6 is active because of an "L"-level signal LPFen. The phase-locked loop 6 frequency-divides the reference clock RefClk so as to correspond to the frequency channel ch9 designated by the signal ChannelCont. The phase-locked loop 6 sets the control voltage Vch so as to lock the phases of the frequency-divided clock and oscillation signal VCOout1 (time t2).

When the signal PAen changes to the "H" level, the power amplifier 5 is activated to amplify the oscillation signals VCOout1 and VCOout2 and output the transmission signal RFout having the frequency finit (time t3).

When the operation of the voltage-controlled oscillator 4 is stabilized, the activation signal LPFen of the low-pass filter 3 changes to the "H" level (time t4) to activate the low-pass filter 3 (a voltage corresponding to data can be output). The data DATA from the baseband LSI 2 is transferred to the low-pass filter 3. At the same time, the feedback loop of the phase-locked loop 6 is broken to hold the level of the control voltage Vch. In this state, the voltage Vmod applied from the low-pass filter 3 to the input terminal V2 of the voltage-controlled oscillator 4 is changed (increased or decreased) in accordance with "1" or "0" data DATA, thus modulating the oscillation frequency finit.

If, for example, the data DATA is "1", the voltage Vmod rises from the level of the reference voltage Vref to a level corresponding to "1", and the frequencies of the oscillation signals VCOout1 and VCOout2 output from the voltage-controlled oscillator 4 change (rise) to f1. The power amplifier 5 amplifies outputs from the voltage-controlled oscillator 4 to output a transmission signal RFout having the frequency f1.

If the data DATA is inverted to "0" (time t5), the voltage Vmod drops from the level corresponding to "1" to a level corresponding to "0", and the frequency of the oscillation signal VCOout1 output from the voltage-controlled oscillator 4 changes (drops) to f0. As a result, the power amplifier 5 outputs a transmission signal RFout having the frequency f0.

After time t6, the above-described operation is repeated in accordance with "1" or "0" data DATA.

When the signal LPFen is inverted to the "L" level at time t7, reception of the data DATA from the baseband LSI 2 stops, the feedback loop of the phase-locked loop 6 operates, and the level of the control voltage Vch returns to the initial state. The voltage Vmod returns to the reference voltage Vref, the signal VCOen changes to the "L" level, and the frequencies of the oscillation signals VCOout1 and VCOout2 return to the initial value finit. The signal PAen changes to the "L" level, and the transmission signal RFout output from the power amplifier 5 stops (time t8).

At time t9, the frequency channel changes from ch9 to ch55 by the signal ChannelCont, and the operation at t1 to t8 is repeated.

FIG. 3 shows a circuit arrangement example of the voltage-controlled oscillator 4 in the communication system 1 shown in FIG. 1. The voltage-controlled oscillator 4 comprises channel selection voltage-variable capacitive elements (frequency channel varactor diodes or varicap diodes) Cch1 and Cch2, frequency modulation voltage-variable capacitive elements (frequency channel varactor diodes or varicap diodes) Cmod1 and Cmod2, an inductance element L1, and inverters 11 and 12. One terminal (cathode) of each of the voltage-variable capacitive elements Cch1 and Cch2 is commonly connected to the input terminal V1, and receives the control voltage Vch (voltage corresponding to the channel frequency: e.g., 1.5 V) output from the phase-locked loop 6. The control voltage Vch is regulated to a value at which the frequency falls within a desired range even if a power supply $V_{DD}$ or temperature Temp varies.

One terminal (cathode) of each of the voltage-variable capacitive elements Cmod1 and Cmod2 is commonly connected to the input terminal V2, and receives the voltage Vmod output from the low-pass filter 3. The voltage Vmod finely adjusts the oscillation frequency, and is, e.g., 1.25 V. The other terminal (anode) of the voltage-variable capacitive element Cch1 and the other terminal (anode) of the voltage-variable capacitive element Cmod1 are connected to the output terminal out1 which outputs the oscillation signal VCOout1. The other terminal (anode) of the voltage-variable capacitive element Cch2 and the other terminal (anode) of the voltage-variable capacitive element Cmod2 are connected to the output terminal out2 which outputs the oscillation signal VCOout2.

The inductance element L1 is connected between the output terminals out1 and out2. The input terminal of the inverter 11 is connected to the output terminal out1, and the output terminal is connected to the output terminal out2. The input terminal of the inverter 12 is connected to the output terminal out2, and the output terminal is connected to the output terminal out1. The oscillation signals VCOout1 and VCOout2 output from the output terminals out1 and out2 oscillate within a range of 0.4 to 1.2 V centered on a voltage Vcm.

FIG. 4A shows the operating points of the channel selection voltage-variable capacitive elements Cch1 and Cch2 during locking to the channel frequency by the phase-locked loop 6. FIG. 4B shows the operating points of the frequency modulation voltage-variable capacitive elements Cmod1 and Cmod2 during locking to the channel frequency by the phase-locked loop 6. As shown in FIG. 4A, the voltage Vch (V(variCap)) applied to the voltage-variable capacitive elements Cch1 and Cch2 changes within a range of 0.3 to 1.1 V. At this time, a capacitance Cch (C(variCap)) decreases along with an increase in voltage Vch. As shown in FIG. 4B, the voltage Vmod (V(variCap)) applied to the variable capacitive elements Cmod1 and Cmod2 changes within a range of 0.05 to 0.85 V. At this time, a capacitance Cmod (C(variCap)) also decreases along with an increase in voltage Vmod.

FIG. 5 shows the operating points of the channel selection voltage-variable capacitive elements Cch1 and Cch2 in frequency modulation. In FIG. 5, the voltage Vmod is shifted by ±25 mV from the value (1.25 V) in locking, and desired frequency modulation is performed. As shown in FIG. 5, the operating point of the channel selection voltage-variable capacitive element Cch is almost the same as that in FIG. 4A because the voltage Vch remains unchanged and a change in voltage Vmod is small.

FIGS. 6A and 6B respectively show the operating point of the frequency modulation voltage-variable capacitive element Cmod (Cmod1 and Cmod2) for data of "1" and "0". As shown in FIG. 6A, for "1" data, the voltage Vmod rises by 25 mV from the reference voltage, and changes within a range of 0.075 to 0.875 V. As a result, the average capacitance of the capacitance Cmod decreases, and the oscillation frequency f1 rises by df from finit obtained at the reference voltage Vref (f1=finit+df).

As shown in FIG. 6B, for "0" data, the voltage Vmod drops by 25 mV from the reference voltage, and changes within a range of 0.025 to 0.825 V. The average capacitance of the capacitance Cmod increases, and the oscillation frequency f0 drops by df from finit obtained at the reference voltage Vref (f0=finit−df).

That is, capacitance differences of 25 mV on the two sides of the voltage amplitude before and after modulation correspond to modulation frequencies. These capacitance change differences are shown in FIG. 6C. The capacitance change difference corresponds to 0.67 fF, and the temperature characteristic is generated from the difference between a capacitance C (0.05 V) increased after modulation and a capacitance C (0.85 V) decreased after modulation. Especially for "0" data, as shown in FIG. 6C, the capacitance increases by C (0.05V)−C (0.85V), and the oscillation frequency of the voltage-controlled oscillator 4 is decreased by this difference.

FIGS. 7A and 7B are a circuit diagram and sectional view, respectively, showing the voltage-variable capacitive elements Cmod1 and Cmod2. An N-type well region (Nwell) 12 is formed in a P-type semiconductor substrate (Psub) 11. $P^+$-type impurity diffusion regions 13-1 to 13-n which operate as the anode of the voltage-variable capacitive element Cmod1, and a $P^+$-type impurity diffusion region 15 which operates as the anode of the voltage-variable capacitive element Cmod2 are formed in the well region 12. The voltage-variable capacitive element Cmod1 is constituted by parallel-connecting n P-N junction diodes, and is n times in size than the voltage-variable capacitive element Cmod2. $N^+$-type impurity diffusion regions 14-1 and 14-2 are also formed in the well region 12 to receive the voltage Vmod. The well region 12 operates as the cathodes of the voltage-variable capacitive elements Cmod1 and Cmod2.

FIG. 8 shows the C-V characteristic of the voltage-variable capacitive elements Cmod1 and Cmod2. As shown in FIG. 7B, the P-N junctions of the P-N junction diodes are used as the voltage-dependent voltage-variable capacitive elements Cmod1 and Cmod2. Thus, the temperature dependency of the C-V characteristic appears through the temperature dependency of the built-in potential, as shown in FIG. 8. In FIG. 8, a solid line C(LT) represents changes in capacitance at low temperatures, and a broken line C(HT) represents changes in capacitance at high temperatures. −Vbi(LT) represents built-in potentials at low temperatures, and −Vbi(HT) represents built-in potentials at high temperatures. Letting Vf be the forward voltage of the P-N junction diode, and Vbi be the built-in potential, a capacitance C(t) is given by $$C(t)=K/(Vf+Vbi)^a$$

where a is the slope, and K is the constant.

FIG. 9 shows a circuit arrangement example of the low-pass filter 3 in the communication system 1 shown in FIG. 1. The low-pass filter 3 comprises a band gap reference 7, digital-to-analog converter 8, and filter 9. The band gap reference 7 generates the reference voltage Vref which hardly depends on the temperature. The digital-to-analog converter 8 receives the reference voltage Vref generated by the band gap reference 7, sets an analog voltage in accordance with "1" or "0" data DATA and the level of the signal LPFen, and outputs the analog voltage. The output voltage from the digital-to-analog converter 8 is applied to the filter 9, and the voltage Vmod output from the filter 9 is applied to the input terminal V2 of the voltage-controlled oscillator 4.

FIG. 10 shows a comparison between the C-V characteristic of the low-pass filter 3 shown in FIG. 9 and the temperature dependency of a voltage Veff. The voltage Veff is a potential difference between the two terminals of the varactor diode, and is given by "Veff=Vcm−Vmod". As shown in FIG. 10, the modulation frequency greatly shifts together with temperature variations because the temperature dependencies of the control voltage (1.25 V) and modulation voltage (25 mV) are much lower than that of the C-V characteristic in a conventional direct frequency modulation method. If the modulation frequency greatly shifts from the setting value, it becomes a noise source to an adjacent channel. To prevent this, the temperature dependency of the modulation frequency is desirably set low.

The temperature dependency of a capacitance which modulates the frequency is quantitatively given by equation (1).

$$dC(RT) = \int_{0.05V}^{0.85V} [C(V)dV]/0.8\,V - \int_{0.075V}^{0.875V} [C(V)dV]/0.8\,V$$
$$= [C(0.05\,V, RT) - C(0.85\,V, RT)] \times 0.025/0.8$$

$$dC(HT) - dC(RT)]/dC(RT) = [\{C(0.05\,V, HT) - C(0.85\,V, HT)\} -$$
$$\{C(0.05\,V, RT) - C(0.85\,V, RT)\}]/$$
$$\{C(0.05\,V, RT) - C(0.85\,V, RT)\}$$
$$= [C(0.05\,V, RT) \times a(0.05\,V) -$$
$$C(0.85\,V, RT) \times a(0.85\,V)]/$$
$$\{C(0.05\,V, RT) - C(0.85\,V, RT)\}$$
$$= a(0.85\,V) + \{a(0.05\,V) - a(0.85\,V)\} \times$$
$$C(0.05\,V, RT)/\{C(0.05\,V, RT) -$$
$$C(0.85\,V, RT)\} \gg a(0.85\,V)$$

In equation (1), "a(0.05 V)–a(0.85 V)" representing the temperature coefficient difference is physically inevitable. "C(0.05 V, RT)–C(0.85 V, RT)" amplifies the temperature coefficient difference (current amplification factor is about 5).

As is apparent from equation (1), the temperature dependency of the capacitance value at the maximum value of the operating voltage of the voltage-variable capacitive element is smaller than that of the capacitance value at the minimum value. The temperature dependency, therefore, remains in the difference between the two capacitance values. The temperature coefficient of the difference capacitance dC is multiplied by the amplification term given by the second term to be several times larger than the temperature coefficient of the capacitance C.

As described above, a conventional direct frequency modulation apparatus undesirably functions as a noise source to an adjacent communication channel upon temperature variations in modulation frequency.

The same problem also occurs in a communication system having the direct frequency modulation apparatus.

BRIEF SUMMARY OF THE INVENTION

According to one aspect of the present invention, there is provided a direct frequency modulation apparatus comprising a voltage-controlled oscillator which comprises a first voltage-variable capacitive circuit that is so constituted as to change a capacitance value by a first voltage applied to a first control terminal, and a second voltage-variable capacitive circuit that is so constituted as to change a capacitance value by a second voltage applied to a second control terminal, and oscillates at frequencies corresponding to the first and second voltages applied to the first and second control terminals, a phase-locked loop which is connected to the first control terminal, locks an oscillation frequency of the voltage-controlled oscillator to a predetermined frequency, and then holds the first voltage applied to the first control terminal, and a voltage generation circuit which is connected to the second control terminal, applies the second voltage to the second control terminal during a locking period of the phase-locked loop, and after the locking period of the phase-locked loop, generates a modulation voltage obtained by changing the second voltage by a third voltage in accordance with input data, the second voltage being applied to the second control terminal, wherein temperature dependency of the second voltage is higher than temperature dependency of a potential difference between two terminals of an element which provides a capacitance value in the second voltage-variable capacitive circuit.

According to another aspect of the present invention, there is provided a direct frequency modulation apparatus comprising a voltage-controlled oscillator which comprises a first voltage-variable capacitive circuit that is so constituted as to change a capacitance value by a first voltage applied to a first control terminal, and a second voltage-variable capacitive circuit that is so constituted as to change a capacitance value by a second voltage applied to a second control terminal, and oscillates at frequencies corresponding to the first and second voltages applied to the first and second control terminals, a phase-locked loop which is connected to the first control terminal, locks an oscillation frequency of the voltage-controlled oscillator to a predetermined frequency, and then holds the first voltage applied to the first control terminal, and a voltage generation circuit which is connected to the second control terminal, applies the second voltage to the second control terminal during a locking period of the phase-locked loop, and after the locking period of the phase-locked loop, generates a modulation voltage obtained by changing the second voltage by a third voltage in accordance with input data, the second voltage being applied to the second control terminal, wherein the second voltage is given by a difference between a fourth voltage whose temperature dependency is lower than temperature dependency of a potential difference between two terminals of an element which provides a capacitance value in the second voltage-variable capacitive circuit, and a fifth voltage proportional to the potential difference between the two terminals of the element.

According to still another aspect of the present invention, there is provided a direct frequency modulation apparatus comprising a voltage-controlled oscillator which comprises a first voltage-variable capacitive circuit that is so constituted as to change a capacitance value by a first voltage applied to a first control terminal, and a second voltage-variable capacitive circuit that is so constituted as to change a capacitance value by a second voltage applied to a second control terminal, and oscillates at frequencies corresponding to the first and second voltages applied to the first and second control terminals, a phase-locked loop which is connected to the first control terminal, locks an oscillation frequency of the voltage-controlled oscillator to a predetermined frequency, and then holds the first voltage applied to the first control terminal, and a voltage generation circuit which is connected to the second control terminal, applies the second voltage to the second control terminal during a locking period of the phase-locked loop, and after the locking period of the phase-locked loop, generates a modulation voltage obtained by changing the second voltage by a third voltage in accordance with input data, the second voltage being applied to the second control terminal, wherein the second voltage is given by a fourth voltage whose temperature dependency is lower than temperature dependency of a potential difference between two terminals of an element which provides a capacitance value in the second voltage-variable capacitive circuit.

According to still another aspect of the present invention, there is provided a direct frequency modulation apparatus comprising a voltage-controlled oscillator whose oscillation frequency changes on the basis of voltages applied to first and second control terminals, the voltage-controlled oscillator comprising first and second voltage-variable capacitive elements having first terminals commonly connected to the first control terminal, third and fourth voltage-variable capacitive elements having first terminals commonly connected to the second control terminal, a first capacitor having one electrode connected to a second terminal of the third voltage-variable capacitive element and the other electrode connected to a second terminal of the first voltage-variable capacitive element, a second capacitor having one electrode connected to a second terminal of the fourth voltage-variable capacitive element and the other electrode connected to a second terminal of the second voltage-variable capacitive element, and an inductor which is connected between the second terminals of the first and second voltage-variable capacitive elements.

According to still another aspect of the present invention, there is provided a direct frequency modulation apparatus comprising a voltage-controlled oscillator whose oscillation frequency changes on the basis of voltages applied to first and second control terminals, the voltage-controlled oscillator comprising at least one inductor, first and second voltage-variable capacitive elements having first terminals commonly connected to the first control terminal, third and fourth voltage-variable capacitive elements having first terminals commonly connected to the second control terminal, a first capacitor having one electrode connected to a second terminal of the first voltage-variable capacitive element and the other electrode connected to a first terminal of the inductor, a second capacitor having one electrode connected to a second terminal of the second voltage-variable capacitive element and the other electrode connected to a second terminal of the inductor, a third capacitor having one electrode connected to a second terminal of the third voltage-variable capacitive element and the other electrode connected to the first terminal of the inductor, and a fourth capacitor having one electrode connected to a second terminal of the fourth voltage-variable capacitive element and the other electrode connected to the second terminal of the inductor.

BRIEF DESCRIPTION OF THE SEVERAL VIEWS OF THE DRAWING

FIG. 5 is a graph showing a C-V characteristic representing the operating point of the channel selection voltage-variable capacitive element in frequency modulation;

FIG. 6A is a graph showing a C-V characteristic representing the operating point of the frequency modulation voltage-variable capacitive element for "1" data;

FIG. 6B is a graph showing a C-V characteristic representing the operating point of the frequency modulation voltage-variable capacitive element for "0" data;

FIG. 6C is a graph showing the difference in the operating point of the frequency modulation voltage-variable capacitive element between "1" data and "0" data;

FIG. 11 is a block diagram showing an extracted part of a communication system in order to explain the schematic arrangement of a direct frequency modulation apparatus according to the first embodiment of the present invention;

FIG. 12 is a circuit diagram showing an arrangement example of a low-pass filter in the communication system shown in FIG. 11;

FIG. 21 is a circuit diagram for explaining a direct frequency modulation apparatus and communication system according to the fifth embodiment of the present invention;

FIG. 25 is a circuit diagram showing an arrangement example of a bias circuit in the voltage-controlled oscillator shown in FIG. 24;

FIG. 26 is a circuit diagram showing another arrangement example of the bias circuit in the voltage-controlled oscillator shown in FIG. 24;

FIG. 34A is a circuit diagram of a CMOS negative conductor element showing an arrangement example of a negative conductor element in FIGS. 32 and 33;

FIG. 34B is a circuit diagram of an NMOS negative conductor element showing another arrangement example of the negative conductor element in FIGS. 32 and 33;

FIG. 34C is a circuit diagram of a PMOS negative conductor element showing still another arrangement example of the negative conductor element in FIGS. 32 and 33;

FIG. 35 is a circuit diagram showing an arrangement example of a bias circuit which applies a bias voltage to the voltage-controlled oscillator shown in FIGS. 32 and 33;

FIG. 36A is a graph showing the temperature dependency of the C-V characteristic of a varactor;

FIG. 36B is a graph showing the I-V characteristic of the bias circuit;

FIG. 37 is a block diagram showing still another arrangement example of the voltage-controlled oscillator in order to explain a direct frequency modulation apparatus and communication system according to the 11th embodiment of the present invention;

FIG. 38 is a circuit diagram showing a detailed arrangement example of the voltage-controlled oscillator shown in FIG. 37;

FIG. 42 is a block diagram showing still another arrangement example of the voltage-controlled oscillator in order to explain a direct frequency modulation apparatus and communication system according to the 12th embodiment of the present invention;

FIG. 43 is a circuit diagram showing a detailed arrangement example of the voltage-controlled oscillator shown in FIG. 42;

FIG. 44 is a block diagram showing still another arrangement example of the voltage-controlled oscillator in order to explain a direct frequency modulation apparatus and communication system according to the 13th embodiment of the present invention; and FIG. 45 is a circuit diagram showing a detailed arrangement example of the voltage-controlled oscillator shown in FIG. 44.

DETAILED DESCRIPTION OF THE INVENTION

[First Embodiment]

Figure 1:
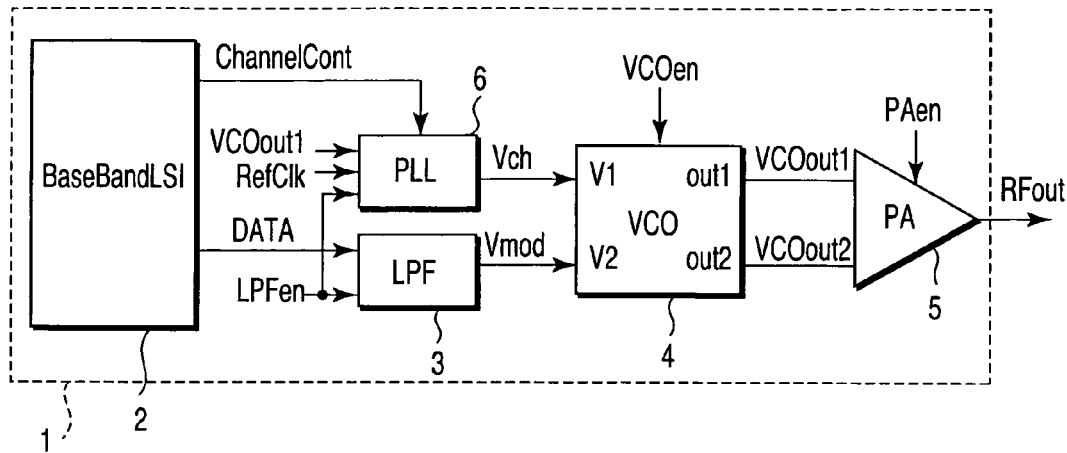
FIG. 1 is a block diagram showing extracted part of a communication system in order to explain the schematic arrangement of a conventional direct frequency modulation apparatus.
Figure 2:
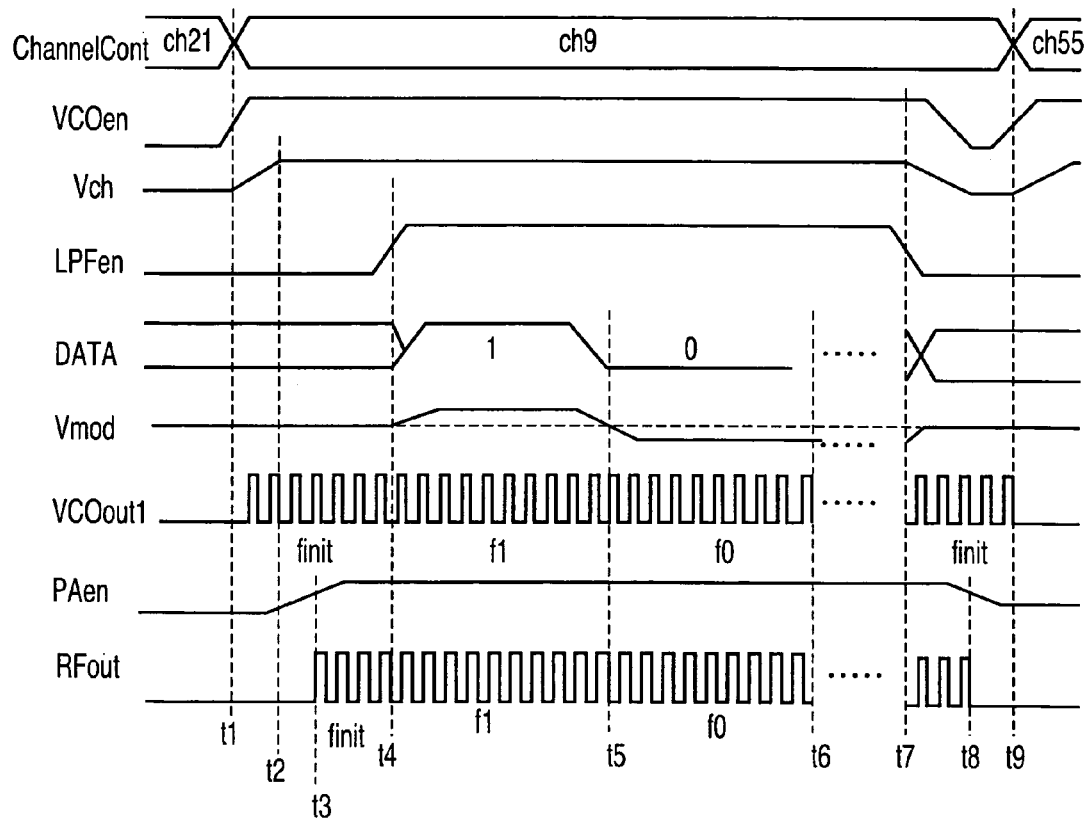
FIG. 2 is a timing chart showing the waveform of each signal in the communication system shown in FIG. 1.

FIG. 11 is a block diagram showing an extracted part of a communication system in order to explain the schematic arrangement of a direct frequency modulation apparatus according to the first embodiment of the present invention. The basic arrangement is the same as that of the conventional communication system 1 shown in FIG. 1. The frequency is modulated by changing a voltage Vmod applied to the control terminal of a voltage-controlled oscillator (VCO) in accordance with data of "1" or "0".

A communication system 21 includes a baseband LSI (BaseBand LSI) 22, low-pass filter (LPF) 23, voltage-controlled oscillator (VCO) 24, power amplifier (PA) 25, and phase-locked loop (PLL) 26.

The baseband LSI 22 controls each circuit in the system. Transmission data DATA output from the baseband LSI 22 is supplied to the low-pass filter 23, and a signal Channel-Cont for designating a frequency channel is supplied to the phase-locked loop 26. A signal LPFen is supplied to the low-pass filter 23 and phase-locked loop 26 to control their activation/inactivation.

A reference clock RefClk and an oscillation signal VCOout1 output from the voltage-controlled oscillator 24 are input to the phase-locked loop 26. The reference clock RefClk is frequency-divided by a frequency channel designated by the signal ChannelCont supplied from the baseband LSI 22. A control voltage (voltage for setting a channel frequency) Vch is so regulated as to lock the phases of the frequency-divided clock and oscillation signal VCOout1, and is applied to one input terminal (control terminal) V1 of the voltage-controlled oscillator 24. During this regulation period, a voltage Vmod having negative temperature dependency is applied from the low-pass filter 23 to the other input terminal (control terminal) V2 of the voltage-controlled oscillator 24. The temperature dependency of the voltage Vmod is higher than the temperature dependency of the potential difference between the two terminals of an element (voltage-variable capacitive element) which provides a capacitance value in the voltage-controlled oscillator 24. Activation/inactivation of the voltage-controlled oscillator 24 is controlled by a signal VCOen, and the voltage-controlled oscillator 24 operates as a frequency modulation circuit together with the low-pass filter 23.

Oscillation signals VCOout1 and VCOout2 output from output terminals out1 and out2 of the voltage-controlled oscillator 24 are supplied to the power amplifier 25 where they are amplified to output a transmission signal RFout. A signal PAen is supplied to the power amplifier 25 to control its activation/inactivation.

Figure 9:
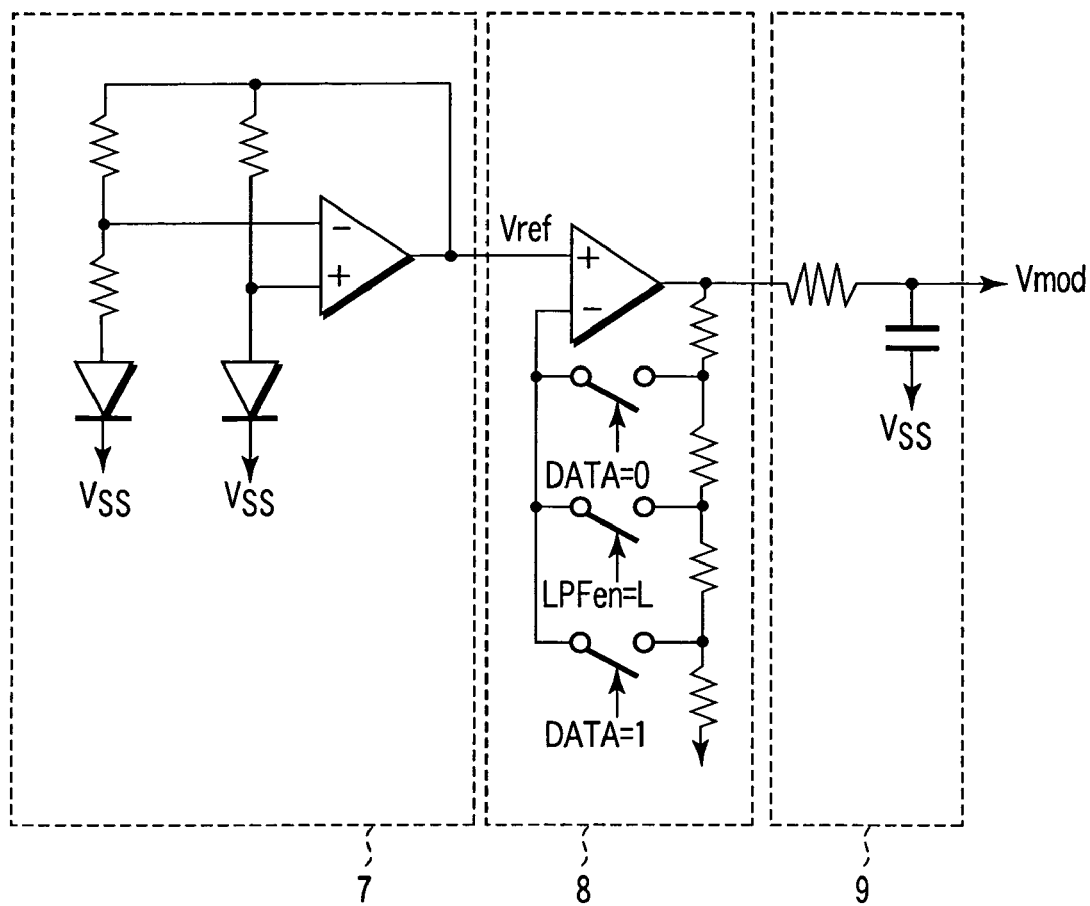
FIG. 9 is a circuit diagram showing an arrangement example of a low-pass filter in the communication system shown in FIG. 1.
Figure 10:
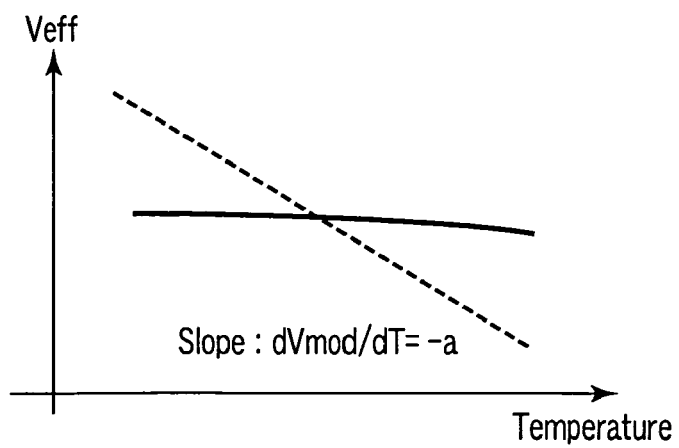
FIG. 10 is a graph showing a comparison between the C-V characteristic of the low-pass filter shown in FIG. 9 and the temperature dependency of a voltage Veff.

FIG. 12 shows a circuit arrangement example of the low-pass filter 23 in the communication system 21 shown in FIG. 11. The low-pass filter 23 is different from the low-pass filter 3 shown in FIG. 9 in that a reference voltage generation circuit 27 having temperature dependency (with a negative temperature coefficient) is adopted instead of the band gap reference circuit 7. A digital-to-analog converter 28 and filter 29 have the same circuit arrangements as those in FIG. 9.

The reference voltage generation circuit 27 comprises P-channel MOS transistors Q1 to Q3, an operational amplifier 30, resistors R1 to R4, and voltage-variable capacitive elements D1 and D2. The sources of the MOS transistors Q1 and Q2 are connected to a power supply $V_{DD}$. The drain of the MOS transistor Q1 is connected to the inverting input terminal (−) of the operational amplifier 30, and the drain of the MOS transistor Q2 is connected to the non-inverting input terminal (+) of the operational amplifier 30. The gates of the MOS transistors Q1 and Q2 are connected to the output terminal of the operational amplifier 30. The resistor R1 and the anode-cathode path of the voltage-variable capacitive element D1 are parallel-connected between the drain of the MOS transistor Q1 and a ground point $V_{SS}$. The drain of the MOS transistor Q2 is connected to one terminal of the resistor R2, and the anode-cathode path of the voltage-variable capacitive element D2 is connected between the other terminal of the resistor R2 and the ground point $V_{SS}$. The resistor R3 is connected between the drain of the MOS transistor Q2 and the ground point $V_{SS}$.

The source of the MOS transistor Q3 is connected to the power supply $V_{DD}$, and the gate is connected to the output terminal of the operational amplifier 30. One terminal of the resistor R4 is connected to the drain of the MOS transistor Q3, and the other terminal is connected to the ground point $V_{SS}$. The reference voltage Vref having a negative temperature coefficient is output from the node between the MOS transistor Q3 and the resistor R4.

Figure 8:
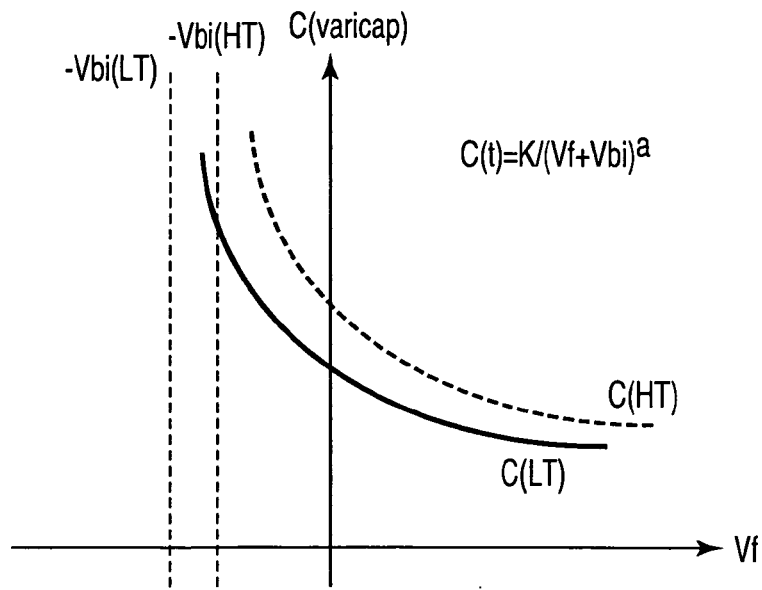
FIG. 8 is a graph showing the C-V characteristic of the frequency modulation voltage-variable capacitive element.
Figure 13:
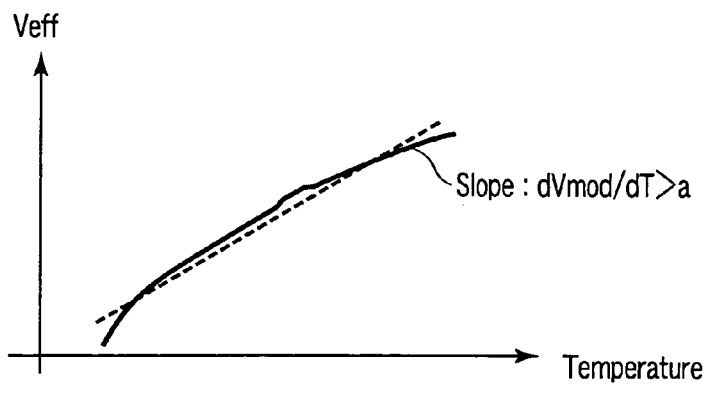
FIG. 13 is a graph showing variations in voltage Vmod upon temperature changes in the circuit shown in FIG. 12.

The reference voltage generation circuit 27 basically has the same circuit arrangement as that of a general band gap reference circuit having no (or low) temperature dependency. The reference voltage generation circuit 27 adjusts the resistance values of the three resistors R1 to R3 to set a negative temperature coefficient. Upon temperature changes, the voltage Vmod fluctuates with a characteristic having a predetermined slope (dVmod/dT>a), as shown in FIG. 13. Veff represents an effective voltage applied to the voltage-variable capacitive element, and can be expressed by Veff=Vmod−Vcm with signs shown in the VCO of FIG. 3. The parameter a represents a temperature coefficient dVbi/dT having the C-V curve in FIG. 8.

All the resistance values of the resistors R1 to R3 need not be changed, and at least one resistance value may be changed in accordance with a necessary characteristic. In addition to setting of the resistance values of the resistors R1 to R3, the size ratio of the voltage-variable capacitive elements D1 and D2 or the size ratio of the MOS transistors Q1 and Q2 may be adjusted, or the change amount of the voltage Vmod upon temperature changes may be adjusted by a combination of these settings.

The digital-to-analog converter 28 includes an operational amplifier 31, switches SW1 to SW3, and resistors R5 to R8. The non-inverting input terminal (+) of the operational amplifier 31 receives the reference voltage Vref output from the reference voltage generation circuit 27. The resistors R5 to R8 are series-connected between the output terminal of the operational amplifier 31 and the ground point $V_{SS}$. One terminal of the switch SW1 is connected to the inverting input terminal (−) of the operational amplifier 31, and the other terminal is connected to the node between the resistors R5 and R6. The switch SW1 is turned on for "0" data DATA. One terminal of the switch SW2 is connected to the inverting input terminal (−) of the operational amplifier 31, and the other terminal is connected to the node between the resistors R6 and R7. The switch SW2 is turned on for an "L"-level signal LPFen. One terminal of the switch SW3 is connected to the inverting input terminal (−) of the operational amplifier 31, and the other terminal is connected to the node between the resistors R7 and R8. The switch SW3 is turned on for "1" data DATA.

The filter 29 comprises a resistor R9 and capacitive element (capacitor) C0. One terminal of the resistor R9 is connected to the output terminal of the operational amplifier 31. The capacitive element C0 is connected between the other terminal of the resistor R9 and the ground point $V_{SS}$. The voltage Vmod having temperature dependency is output from the other terminal of the resistor R9.

Figure 14:
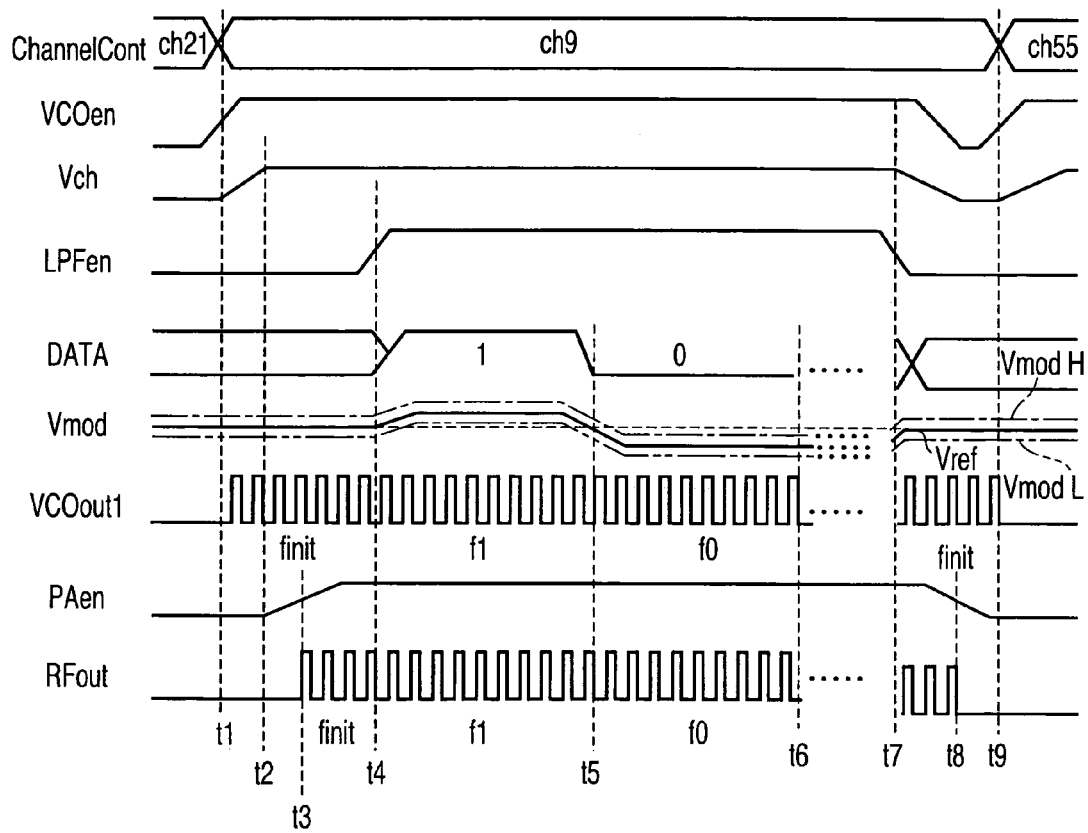
FIG. 14 is a timing chart showing the waveform of each signal in the communication system shown in FIGS. 11 and 12.

FIG. 14 is a timing chart showing the waveform of each signal in the communication system 21 shown in FIGS. 11 and 12. At time t1, the signal ChannelCont changes, the frequency channel changes from ch21 to ch9, and the signal VCOen changes to the "H" level to activate the voltage-controlled oscillator 24. The voltage-controlled oscillator 24 then outputs an oscillation signal VCOout1 having a frequency finit corresponding to the voltages Vch and Vmod applied to the input terminals V1 and V2. At this time, the switch SW2 in the digital-to-analog converter 28 of the low-pass filter 23 is turned on by the "L"-level signal LPFen to output the reference voltage Vref as an initial value of the voltage Vmod. The phase-locked loop 26 is activated to frequency-divide the reference clock RefClk so as to correspond to the frequency channel ch9 designated by the signal ChannelCont. The phase-locked loop 26 sets the control voltage Vch so as to lock the phases of the frequency-divided clock and oscillation signal VCOout1 (time t2).

When the signal PAen changes to the "H" level, the power amplifier 25 is activated to amplify the oscillation signals VCOout1 and VCOout2 and output the transmission signal RFout having the frequency finit (time t3).

When the operation of the voltage-controlled oscillator 24 is stabilized, the activation signal LPFen of the low-pass filter 23 changes to the "H" level (time t4). The switch SW2 in the digital-to-analog converter 28 is turned off, and the data DATA from the baseband LSI 22 is transferred to the low-pass filter 23. At the same time, the feedback loop of the phase-locked loop 26 is broken to hold the level of the control voltage Vch. In this state, the voltage Vmod at the input terminal V2 of the voltage-controlled oscillator 24 is changed in accordance with "1" or "0" data DATA, thus modulating the oscillation frequency.

If, for example, the data DATA is "1", the switch SW3 is turned on (switches SW1 and SW2 are turned off), the output voltage from the operational amplifier 31 rises, and the voltage Vmod rises from the level of the reference voltage Vref to a level corresponding to "1". Thus, the frequencies of the oscillation signals VCOout1 and VCOout2 output from the voltage-controlled oscillator 24 rise to f1. The power amplifier 25 amplifies the oscillation signals VCOout1 and VCOout2 output from the voltage-controlled oscillator 24 to output a transmission signal RFout having the frequency f1.

If the data DATA is inverted to "0" (time t5), the switch SW1 is turned on (switches SW2 and SW3 are turned off), the output voltage of the operational amplifier 31 drops, and the voltage Vmod drops from the level corresponding to "1" to a level corresponding to "0". As a result, the frequencies of the oscillation signals VCOout1 and VCOout2 output from the voltage-controlled oscillator 24 change (drop) to f0. The power amplifier 25 outputs a transmission signal RFout having the frequency f0.

After time t6, the above-described operation is repeated in accordance with "1" or "0" data DATA.

At time t7, the signal LPFen is inverted to the "L" level, and transfer of the data DATA from the baseband LSI 22 stops. The switch SW2 in the digital-to-analog converter 28 of the low-pass filter 23 is turned on, and the voltage Vmod returns to the reference voltage Vref. The feedback loop of the phase-locked loop 26 operates, and the level of the control voltage Vch also returns to an initial state. The control voltage Vmod returns to the reference voltage Vref, the signal VCOen changes to the "L" level, and the frequencies of the oscillation signals VCOout1 and VCOout2 return to the initial value finit. The signal PAen changes to the "L" level, and the transmission signal RFout output from the power amplifier 25 stops (time t8).

At time t9, the frequency channel changes from ch9 to ch55 by the signal ChannelCont, and the operation at t1 to t7 is repeated.

A case wherein the temperature changes during operation will be explained. The temperature coefficient of the reference voltage generation circuit 27 is positive, and if the temperature rises, the output voltage Vref rises. The voltage Vref is a voltage serving as the reference of the operating point of the digital-to-analog converter 28, and the output voltage Vmod of the filter 29 rises, as shown in FIG. 13. Hence, for the "L"-level signal LPFen, an "H"-level voltage VrefH is output, the voltage corresponding to "1" or "0" data also drops, and the voltage Vmod rises (see a chain line VmodH in FIG. 14). The increase amount of the voltage Vmod corresponds to the increase amount of the oscillation frequency of the voltage-controlled oscillator 24 upon temperature rise. The frequencies of the oscillation signals VCOout1 and VCOout2 output from the voltage-controlled oscillator 24 are so compensated as to be constant.

If the temperature drops, the output voltage Vref of the reference voltage generation circuit 27 drops. For the "L"-level signal LPFen, the output voltage Vmod of the filter 29 changes to an "L"-level voltage VrefL, a voltage corresponding to "1" or "0" data also drops, and the voltage Vmod drops (see a chain double-dashed line VmodL in FIG. 14). The decrease amount of the voltage Vmod corresponds to the increase amount of the oscillation frequency of the voltage-controlled oscillator 24 upon temperature rise. The frequencies of the oscillation signals VCOout1 and VCOout2 output from the voltage-controlled oscillator 24 are so compensated as to be constant.

This arrangement can suppress variations in the frequencies of the oscillation signals VCOout1 and VCOout2 output from the voltage-controlled oscillator 24 by changing both the initial value and amplitude of the voltage Vmod when the modulation frequency varies depending on the temperature. Accordingly, noise to an adjacent communication channel can be suppressed.

Figure 3:
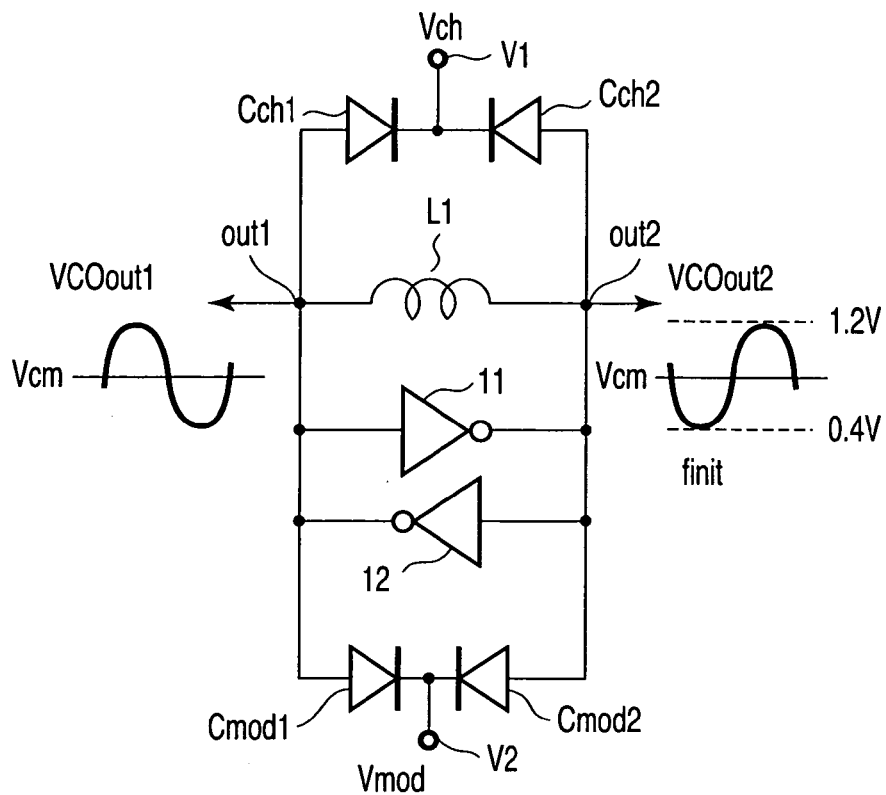
FIG. 3 is a circuit diagram showing a circuit arrangement example of a voltage-controlled oscillator in the communication system shown in FIG. 1.
Figure 4A:
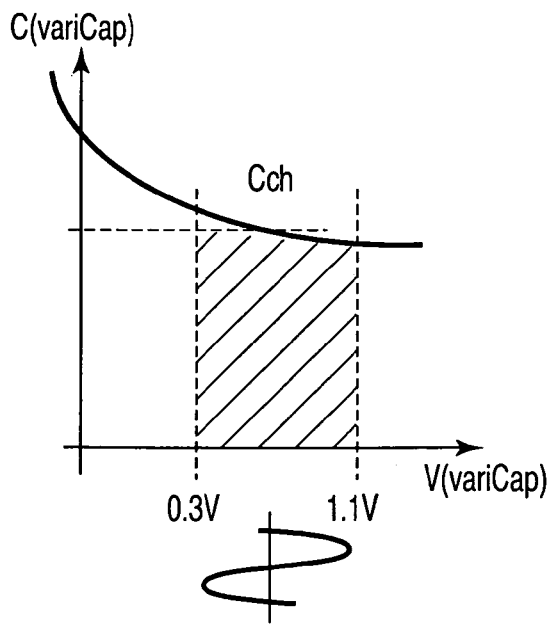
FIG. 4A is a graph showing a C-V characteristic representing the operating point of a channel selection voltage-variable capacitive element during locking to the channel frequency by a phase-locked loop.
Figure 4B:
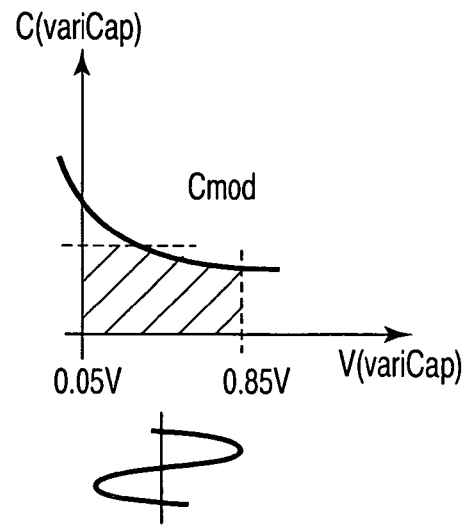
FIG. 4B is a graph showing a C-V characteristic representing the operating point of a frequency modulation voltage-variable capacitive element during locking to the channel frequency by the phase-locked loop.
Figure 7A:
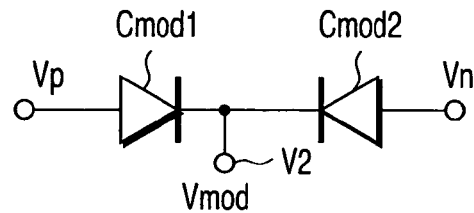
FIG. 7A is a circuit diagram showing the frequency modulation voltage-variable capacitive element.

Note that the voltage-controlled oscillator 24 can adopt the same circuit arrangement as the conventional one shown in FIG. 3. The modulation voltage-variable capacitive elements Cmod1 and Cmod2 in the voltage-controlled oscillator 24 can adopt the structure shown in FIGS. 7A and 7B.

[Second Embodiment]

Figure 15:
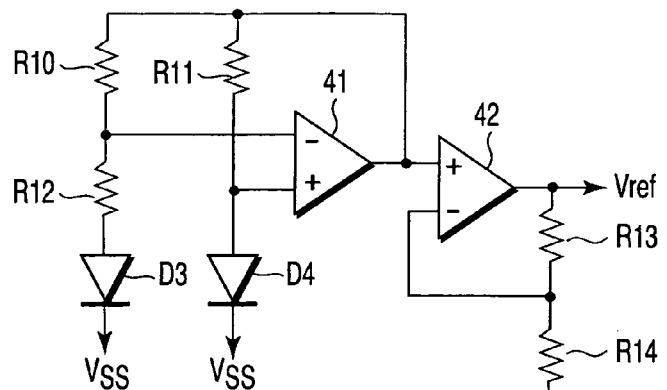
FIG. 15 is a circuit diagram showing another arrangement example of a reference voltage generation circuit in the circuit shown in FIG. 12 in order to explain a direct frequency modulation apparatus and communication system according to the second embodiment of the present invention.

FIG. 15 shows another arrangement example of the reference voltage generation circuit 27 in the circuit shown in FIG. 12 in order to explain a direct frequency modulation apparatus and communication system according to the second embodiment of the present invention. Similar to the circuit shown in FIG. 12, a reference voltage generation circuit shown in FIG. 15 also has a positive temperature coefficient. A voltage Vmod has a characteristic with a slope (dVmod/dT>a) upon temperature changes, as shown in FIG. 13. The temperature dependency of the voltage Vmod is higher than that of the potential difference between the two terminals of an element (voltage-variable capacitive element) which provides a capacitance value in a voltage-controlled oscillator 24.

This circuit includes resistors R10 to R14, voltage-variable capacitive elements D3 and D4, and operational amplifiers 41 and 42. One terminal of each of the resistors R10 and R11 is connected to the output terminal of the operational amplifier 41. The other terminal of the resistor R10 is connected to the inverting input terminal (−) of the operational amplifier 41, and the other terminal of the resistor R11 is connected to the non-inverting input terminal (+) of the operational amplifier 41. The resistor R12 and the anode-cathode path of the voltage-variable capacitive element D3 are series-connected between the other terminal of the resistor R10 and a ground point $V_{SS}$. The non-inverting input terminal (+) of the operational amplifier 41 is connected to the anode of the voltage-variable capacitive element D4, and the cathode of the voltage-variable capacitive element D4 is connected to the ground point $V_{SS}$.

The non-inverting input terminal (+) of the operational amplifier 42 is connected to the output terminal of the operational amplifier 41. The resistors R13 and R14 are series-connected between the output terminal of the operational amplifier 42 and the ground point $V_{SS}$. The inverting input terminal (−) of the operational amplifier 42 is connected to the node between the resistors R13 and R14. A reference voltage Vref is output from the output terminal of the operational amplifier 42.

In order to set a positive temperature coefficient, a reference voltage generation circuit 27 shown in FIG. 15 also adjusts the resistance values of the three resistors R10 to R12 to set a positive temperature coefficient, unlike a general band gap reference circuit having no (or low) temperature dependency. Upon temperature changes, the voltage Vmod fluctuates with a characteristic having a predetermined slope (dVmod/dT>a), as shown in FIG. 13.

Similar to the first embodiment, even this arrangement can suppress variations in the frequencies of oscillation signals VCOout1 and VCOout2 output from the voltage-controlled oscillator 24 by changing (increasing or decreasing) the voltage Vmod when the modulation frequency varies depending on the temperature. Noise to an adjacent communication channel can, therefore, be suppressed.

At least one of the resistance values of the resistors R10 to R12 may be changed in accordance with a necessary characteristic. In addition to these resistance values, the size ratio of the voltage-variable capacitive elements D3 and D4 may be adjusted, or fluctuations in voltage Vmod upon temperature changes may be adjusted by a combination of these settings.

The voltage-controlled oscillator 24 can adopt the same circuit arrangement as the conventional one shown in FIG. 3. Modulation voltage-variable capacitive elements Cmod1 and Cmod2 in the voltage-controlled oscillator 24 can adopt the structure shown in FIGS. 7A and 7B.

[Third Embodiment]

Figure 16A:
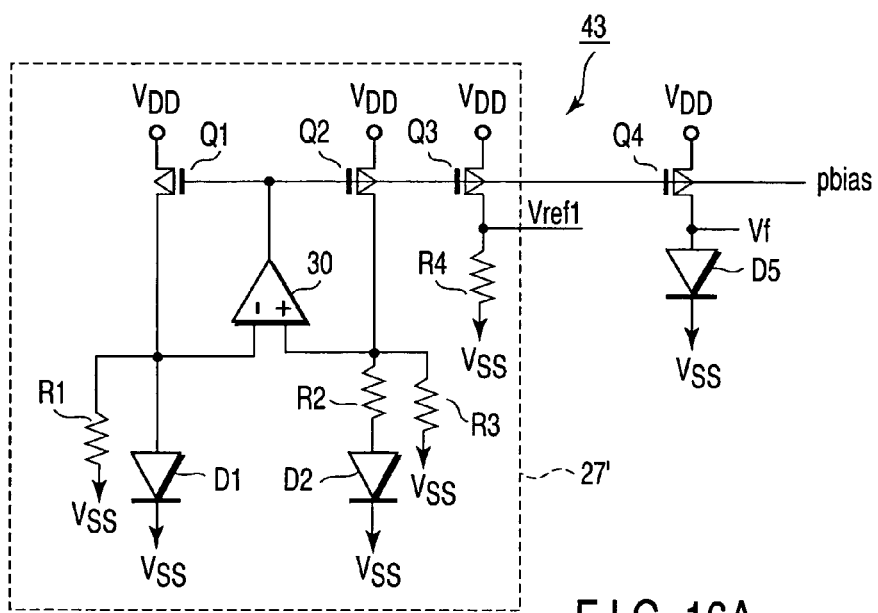
FIG. 16A is a circuit diagram showing an arrangement example of a circuit which outputs a voltage proportional to the sum of a reference current having low temperature dependency and the forward current of a voltage-variable capacitive element by using a band gap reference circuit having low temperature dependency.

FIG. 16A is a circuit diagram for explaining a direct frequency modulation apparatus and communication system according to the third embodiment of the present invention. FIG. 16A shows a circuit which outputs a voltage proportional to the sum of a reference current Iref having low temperature dependency and a forward current If of a voltage-variable capacitive element D5 by using a band gap reference circuit 43 having low temperature dependency. In the circuit arrangement example shown in FIG. 12, the resistance values of the resistors R1 to R3 are shifted to set a positive temperature coefficient. The circuit shown in FIG. 16A has substantially the same circuit arrangement except that the band gap reference circuit 43 is constituted such that an output voltage Vref is regulated constant upon temperature changes by adjustment of the resistance values of resistors R1 to R3, adjustment of the size ratio of voltage-variable capacitive elements D1 and D2, adjustment of the size ratio of MOS transistors Q1 and Q2, or a combination of them.

The band gap reference circuit 43 basically has the same circuit arrangement as that of the reference voltage generation circuit 27 shown in FIG. 12, and is constituted by adding a P-channel MOS transistor Q4 and the voltage-variable capacitive element D5 to a reference voltage generation circuit 27' having low temperature dependency. The source of the MOS transistor Q4 is connected to a power supply $V_{DD}$, and the gate is connected to the output terminal of an operational amplifier 30. The anode of the voltage-variable capacitive element D5 is connected to the drain of the MOS transistor Q4, and the cathode is connected to a ground point $V_{SS}$. A voltage Vf is output from the node between the MOS transistor Q4 and the voltage-variable capacitive element D5.

The voltage-variable capacitive element D5 is desirably a P-N junction diode used in a voltage-variable capacitive element in a voltage-controlled oscillator 24. Even if the built-in potential varies in the manufacture, the reference voltage changes in synchronism with the built-in potential, compensating for the capacitance value at the operating point.

Figure 16B:
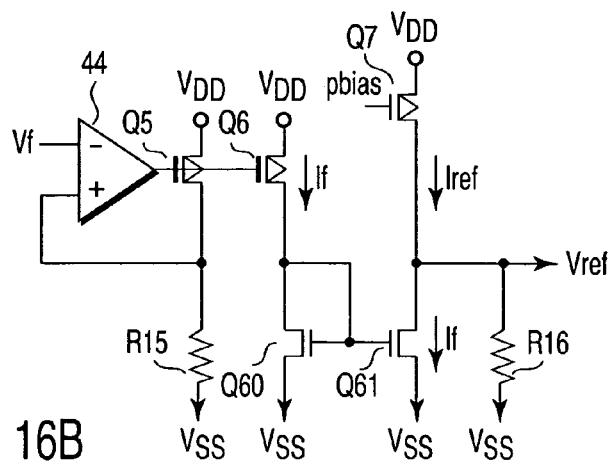
FIG. 16B is a circuit diagram showing a temperature compensation voltage generation circuit which generates a reference voltage by using the voltage output from the circuit shown in FIG. 16A.

FIG. 16B shows a temperature compensation voltage generation circuit which generates the reference voltage Vref having negative temperature dependency by using the voltage Vf output from the circuit shown in FIG. 16A. The temperature compensation voltage generation circuit includes an operational amplifier 44, P-channel MOS transistors Q5, Q6, and Q7, N-channel MOS transistors Q60 and Q61, and resistors R15 and R16. The inverting input terminal (−) of the operational amplifier 44 receives the voltage Vf output from the band gap reference circuit 43. The output terminal of the operational amplifier 44 is connected to the gates of the MOS transistors Q5 and Q6. The source of the MOS transistor Q5 is connected to the power supply $V_{DD}$, and the drain is connected to the non-inverting input terminal (+) of the operational amplifier 44 and one terminal of the resistor R15. The other terminal of the resistor R15 is connected to the ground point $V_{SS}$. The source of the MOS transistor Q6 is connected to the power supply $V_{DD}$, and the drain is connected to the drain and gate of the MOS transistor Q60. The source of the MOS transistor Q60 is connected to the ground point $V_{SS}$. The gate of the MOS transistor Q61 is connected to that of the MOS transistor Q60, the drain is connected to that of the MOS transistor Q7, and the source is connected to the ground point $V_{SS}$. The source of the MOS transistor Q7 is connected to the power supply $V_{DD}$, and the gate is connected to the output terminal of the operational amplifier 30 to receive a bias voltage pbias. The common drain node between the MOS transistors Q7 and Q61 is connected to one terminal of the resistor R16, and the other terminal of the resistor R16 is connected to the ground point $V_{SS}$. The reference voltage (negative temperature coefficient) Vref having temperature dependency is output from the common drain node between the MOS transistors Q7 and Q61.

In the circuit shown in FIG. 16B, the reference voltage Vref is generated on the basis of the current If which flows through the source-drain path of the MOS transistor Q61 and has temperature dependency, and the current Iref which flows through the source-drain path of the MOS transistor Q7 and does not have any temperature dependency. The temperature dependency can be freely set by weighting using the currents If and Iref.

The reference voltage Vref is applied to, e.g., a digital-to-analog converter 28 in FIG. 12 to generate a modulation voltage Vmod via a filter 29. The voltage Vmod is applied to an input terminal V2 of the voltage-controlled oscillator 24. The voltage Vmod is set to the sum of a voltage whose temperature dependency is lower than that of the potential difference between the two terminals of a voltage-variable capacitive element connected to the input terminal V2 of the voltage-controlled oscillator 24, and a voltage proportional to the potential difference between the two terminals of the voltage-variable capacitive element.

Similar to the first and second embodiments, the above arrangement can suppress variations in the frequencies of oscillation signals VCOout1 and VCOout2 output from the voltage-controlled oscillator 24 by changing the voltage Vmod, as shown in FIG. 13, when the modulation frequency varies depending on the temperature. Noise to an adjacent communication channel can be suppressed.

The band gap reference circuit is not limited to the arrangement shown in FIG. 16A, and can employ various arrangements. The forward voltage Vf which is output from the band gap reference circuit and does not have any temperature dependency is supplied to the circuit shown in FIG. 16B, thereby giving predetermined temperature dependency.

The voltage-controlled oscillator 24 can adopt the same circuit arrangement as the conventional one shown in FIG. 3. Modulation voltage-variable capacitive elements Cmod1 and Cmod2 in the voltage-controlled oscillator 24 can adopt the structure shown in FIGS. 7A and 7B.

[Fourth Embodiment]

Figure 17:
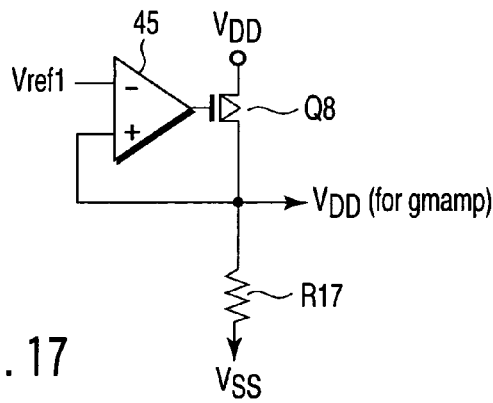
FIG. 17 is a circuit diagram showing an arrangement example of a power supply voltage generation circuit which generates a power supply voltage for a transconductance amplifier by using a potential which is output from the reference voltage generation circuit shown in FIG. 16A and has no temperature dependency, in order to explain a direct frequency modulation apparatus and communication system according to the fourth embodiment of the present invention.
Figure 18:
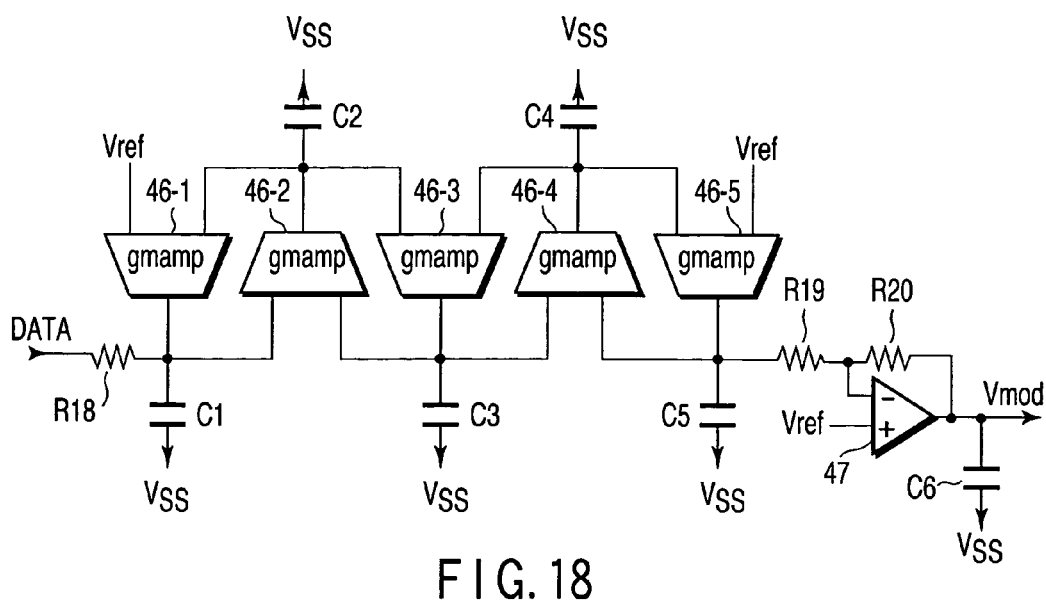
FIG. 18 is a circuit diagram showing a circuit arrangement example when the low-pass filter in the circuit shown in FIG. 11 is formed together with the circuits shown in FIGS. 16A, 16B, and 17.
Figure 19:
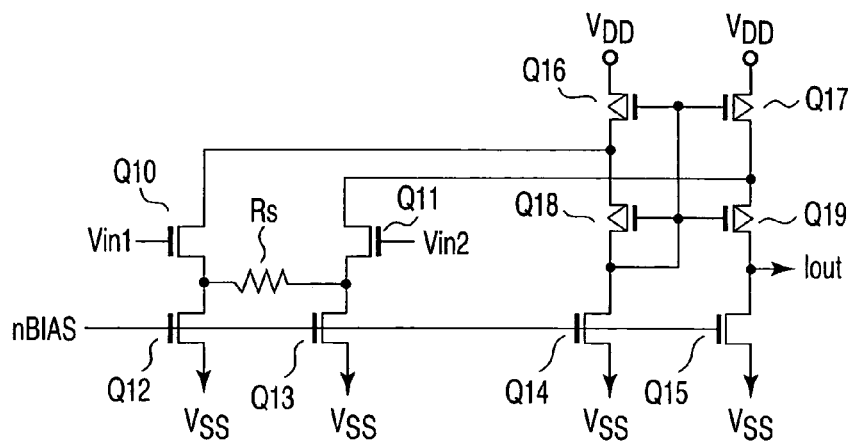
FIG. 19 is a circuit diagram showing a detailed arrangement example of the transconductance amplifier in the circuit shown in FIG. 18.
Figure 20:
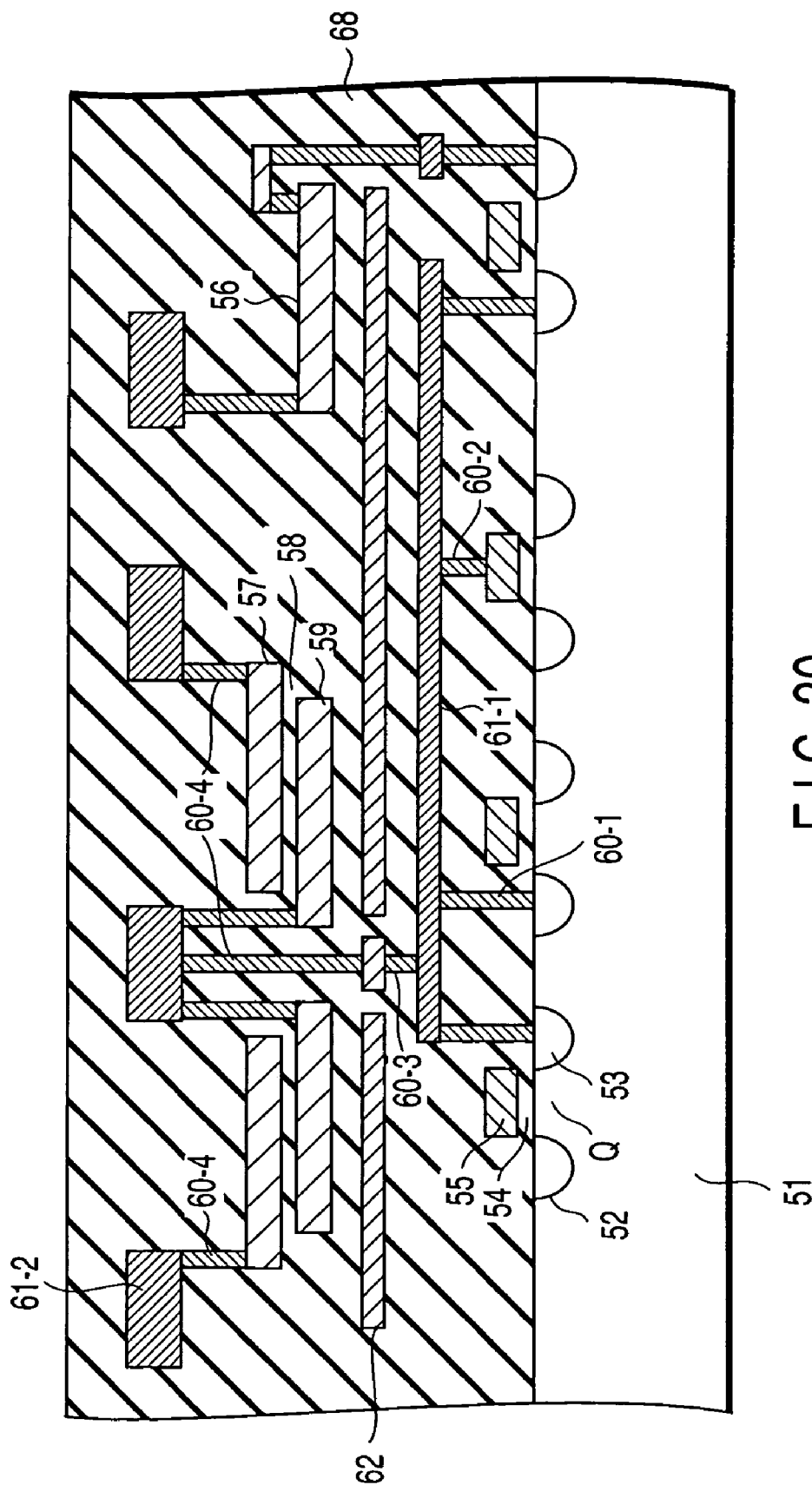
FIG. 20 is a sectional view showing part of the circuit in FIGS. 18 and 19.

FIGS. 17 to 20 are views for explaining a direct frequency modulation apparatus and communication system according to the fourth embodiment of the present invention. FIG. 17 shows an arrangement example of a power supply voltage generation circuit which generates a power supply voltage $V_{DD}$ for a transconductance amplifier by using a voltage Vref1 which is output from the reference voltage generation circuit 27' shown in FIG. 16A and has no (or low) temperature dependency. FIG. 18 shows an arrangement example of a circuit which forms the low-pass filter 23 in the circuit shown in FIG. 11 together with the circuits shown in FIGS. 16A, 16B, and 17. FIG. 19 is a circuit diagram showing a detailed circuit arrangement of the transconductance amplifier (gmamp) in the circuit shown in FIG. 18. FIG. 20 is a sectional view showing part of the circuit in FIGS. 18 and 19.

The circuit shown in FIG. 17 includes an operational amplifier 45, P-channel MOS transistor Q8, and resistor R17. The inverting input terminal (−) of the operational amplifier 45 receives the voltage Vref1 which does not have any temperature dependency and is output from the output terminal (node between the MOS transistor Q3 and the resistor R4) of the reference voltage generation circuit 27' shown in FIG. 16A. The output terminal of the operational amplifier 45 is connected to the gate of the MOS transistor Q8. The source of the MOS transistor Q8 is connected to a power supply $V_{DD}$, and the drain is connected to the non-inverting input terminal (+) of the operational amplifier 45 and one terminal of the resistor R17. The other terminal of the resistor R17 is connected to a ground point $V_{SS}$. The power supply voltage $V_{DD}$ for the transconductance amplifier used in the low-pass filter 23 is output from the node between the MOS transistor Q8 and the resistor R17.

The circuit shown in FIG. 18 includes transconductance amplifiers (gm amplifiers) 46-1 to 46-5 which operate on the basis of the power supply voltage $V_{DD}$ with no temperature dependency output from the circuit shown in FIG. 17, capacitive elements (capacitors) C1 to C6, resistors R18 to R20, and an operational amplifier 47. One terminal of the resistor R18 receives transmission data DATA output from a baseband LSI 22. The other terminal of the resistor R18 is connected to the output terminal of the gm amplifier 46-1 and the first input terminal of the gm amplifier 46-2. The capacitive element C1 is connected between the other terminal of the resistor R18 and the ground point $V_{SS}$. The first input terminal of the gm amplifier 46-1 receives a reference voltage Vref having no (or low) temperature or power supply voltage dependency from, e.g., the circuit shown in FIG. 16B. The second input terminal is connected to the output terminal of the gm amplifier 46-2.

The second input terminal of the gm amplifier 46-2 is connected to the output terminal of the gm amplifier 46-3, and the output terminal is connected to the first input terminal of the gm amplifier 46-3. The capacitive element C2 is connected between the output terminal of the gm amplifier 46-2 and the ground point $V_{SS}$.

The second input terminal of the gm amplifier 46-3 is connected to the output terminal of the gm amplifier 46-4, and the output terminal is connected to the first input terminal of the gm amplifier 46-4. The capacitive element C3 is connected between the output terminal of the gm amplifier 46-3 and the ground point $V_{SS}$.

The second input terminal of the gm amplifier 46-4 is connected to the output terminal of the gm amplifier 46-5, and the output terminal is connected to the first input terminal of the gm amplifier 46-5. The capacitive element C4 is connected between the output terminal of the gm amplifier 46-4 and the ground point $V_{SS}$.

The second input terminal of the gm amplifier 46-5 receives the reference voltage Vref, and the output terminal is connected to one terminal of the resistor R19. The capacitive element C5 is connected between the output terminal of the gm amplifier 46-5 and the ground point $V_{SS}$.

The other terminal of the resistor R19 is connected to the inverting input terminal (−) of the operational amplifier 47. The non-inverting input terminal (+) of the operational amplifier 47 receives the reference voltage Vref, and the resistor R20 is connected between the output terminal and the inverting input terminal (−). The capacitive element C6 is connected between the output terminal of the operational amplifier 47 and the ground point $V_{SS}$, and a voltage Vmod is output from the output terminal of the operational amplifier 47.

In FIG. 18, the reference voltage Vref is applied from the circuit shown in FIGS. 16A and 16B. Alternatively, filtering may be performed by applying a voltage having temperature dependency (with a negative temperature coefficient) from the reference voltage generation circuit 27 shown in FIG. 12 or 15.

As shown in FIG. 19, each of the gm amplifiers 46-1 to 46-5 includes N-channel MOS transistors Q10 to Q15, P-channel MOS transistors Q16 to Q19, and a resistor Rs. The sources of the MOS transistors Q16 and Q17 receive the power supply $V_{DD}$ which is output from the circuit shown in FIG. 17 and has no (or low) temperature dependency. The drains of the MOS transistors Q16 and Q17 are respectively connected to the drains of the MOS transistors Q10 and Q11 and the sources of the MOS transistors Q18 and Q19.

The gates of the MOS transistors Q10 and Q11 function as the first and second input terminals of the gm amplifier, respectively. The resistor Rs is connected between the sources of the MOS transistors Q10 and Q11. The drain-source paths of the MOS transistors Q12 and Q13 are respectively connected between the sources of the MOS transistors Q10 and Q11 and the ground point $V_{SS}$.

The drain-source paths of the MOS transistors Q14 and Q15 are respectively connected between the drains of the MOS transistors Q18 and Q19 and the ground point $V_{SS}$. The gates of the MOS transistors Q12 to Q15 receive a bias voltage nBAIAS. The bases of the MOS transistors Q16 to Q19 are commonly connected, and connected to the drain of the MOS transistor Q18. The common drain node between the MOS transistors Q19 and Q15 functions as an output terminal Iout of the gm amplifier.

This circuit outputs a current dV/rs (rs is the resistance value of the resistor Rs) from the output terminal Iout for a differential input voltage dV=Vin1−Vin2.

FIG. 20 is a sectional view showing part of the circuit in FIGS. 18 and 19. Assuming that a semiconductor substrate 51 is of a P type, for example, the N-channel MOS transistors Q10 to Q15 are formed by N-type source and drain regions 52 and 53 which are formed in the major surface of the substrate 51, gate insulting films 54 which are formed on the substrate 51 between the source and drain regions 52 and 53, and gate electrodes 55 which are formed on the gate insulting films 54 (FIG. 20 representatively illustrates a MOS transistor Q). The P-channel MOS transistors Q16 to Q19 are formed in an N-type well substrate (not shown) formed in the substrate 51.

The resistive elements R18 to R20 are formed by polysilicon layers 56 which are formed above the MOS transistors Q via an interlayer dielectric film 68. The capacitive elements C1 to C6 are formed by upper electrodes 57, insulating films 58, and lower electrodes 59. These elements are electrically connected via contacts in a plurality of layers, and interconnection layers 61-1 and 61-2. Intermediate interconnection layers 62 for shielding ground are interposed between the MOS transistor Q, the lower interconnection layer 61-1, the resistive element 56, the capacitive elements C1 to C6, and the upper interconnection layer 61-2.

In the sectional structure shown in FIG. 20, a resistive element and capacitive element can be arranged above an MOS transistor, suppressing the circuit area. Since ground is shielded using the intermediate interconnection layer 62, capacitive coupling noise between the MOS transistor, the lower interconnection layer, the resistive element, the capacitive element, and the upper interconnection layer can be minimized. Part of the intermediate interconnection layer 62 that connects two layers cannot be grounded, but the remaining region can be shielded.

Similar to the first to fourth embodiments, the above arrangement can compensate for or suppress variations in the frequencies of oscillation signals VCOout1 and VCOout2 output from the voltage-controlled oscillator 24 by changing the voltage Vmod when the modulation frequency varies depending on the temperature. Accordingly, noise to an adjacent communication channel can be suppressed.

Also in this example, the voltage-controlled oscillator 24 can adopt the same circuit arrangement as the conventional one shown in FIG. 3. Modulation voltage-variable capacitive elements Cmod1 and Cmod2 in the voltage-controlled oscillator 24 can adopt the structure shown in FIGS. 7A and 7B.

[Fifth Embodiment]

FIG. 21 is a circuit diagram for explaining a direct frequency modulation apparatus and communication system according to the fifth embodiment of the present invention. A reference voltage generation circuit 27' has substantially the same circuit arrangement as that of the circuit shown in FIG. 16A, and a detailed description thereof will be omitted. An output from the reference voltage generation circuit 27' is supplied to a wave-shaping circuit 69 to output a voltage Vmod which has negative temperature dependency and corresponds to transmission data DATA. The voltage Vmod is set to the sum of a voltage whose temperature dependency is lower than that of the potential difference between the two terminals of a voltage-variable capacitive element connected to an input terminal V2 of a voltage-controlled oscillator 24, and the potential difference between the two terminals of the voltage-variable capacitive element.

More specifically, the inverting input terminal (−) of an operational amplifier 48 receives the reference voltage Vref1 which is output from the reference voltage generation circuit 27' and has no (or low) temperature dependency. The output terminal of the operational amplifier 48 is connected to the gates of P-channel MOS transistors Q20 and Q21. The source of the MOS transistor Q20 is connected to a power supply $V_{DD}$, and the drain is connected to the non-inverting input terminal (+) of the operational amplifier 48. The anode-cathode path of a diode D6 is connected between the drain of the MOS transistor Q20 and a ground point $V_{SS}$. The source of the MOS transistor Q21 is connected to the power supply $V_{DD}$, and the drain is connected to the drain and gate of an N-channel MOS transistor Q62. The source of the MOS transistor Q62 is connected to the ground point $V_{SS}$. The gate of an N-channel MOS transistor Q63 is commonly connected to that of the MOS transistor Q62, and the drain is connected to that of a P-channel MOS transistor Q22. The source of the MOS transistor Q22 is connected to the power supply $V_{DD}$, and the gate is connected to the output terminal of an operational amplifier 30. A resistor R21 is connected between the ground point $V_{SS}$ and the common drain node between the MOS transistors Q22 and Q63.

The source of a P-channel MOS transistor Q23 is connected to the power supply $V_{DD}$, and the gate is connected to the output terminal of the operational amplifier 30. The drain of the MOS transistor Q23 is connected to the source of a P-channel MOS transistor Q24, and the gate receives an inverted signal DATA1B of a signal corresponding to "1" data. The drain of the. MOS transistor Q24 is connected to that of an N-channel MOS transistor Q25, the common drain node between the MOS transistors Q22 and Q63, and one terminal of each of the resistor R21 and a resistor R22. The gate of the MOS transistor Q25 receives a signal DATA0 corresponding to "0" data. The drain-source path of an N-channel MOS transistor Q26 is connected between the source of the MOS transistor Q25 and the ground point $V_{SS}$. The gate of the MOS transistor Q26 is connected to the common drain node between a P-channel MOS transistor Q27 and an N-channel MOS transistor Q28. The source of the MOS transistor Q27 is connected to the power supply $V_{DD}$, and the gate is connected to the output terminal of the operational amplifier 30. The source of the MOS transistor Q28 is connected to the ground point $V_{SS}$, and the gate is connected to the drain.

A capacitive element (capacitor) C7 is connected between the other terminal of the resistor R22 and the ground point $V_{SS}$, and the voltage Vmod is output from the other terminal of the resistor R22.

In this arrangement, a current flowing through the source-drain path of the MOS transistor Q21 is defined as If; a current flowing through the source-drain path of the MOS transistor Q22, as Iref; a current flowing through the source-drain path of the MOS transistor Q23, as b×Iref; and a current flowing through the source-drain path of the MOS transistor Q26, as a×Iref. The resistance value of the resistor R21 is r21.

During PLL locking, the signal DATA0="L" level and the signal DATA1B="H" level, and both the MOS transistors Q25 and Q24 are OFF. The voltage Vmod is given by $$Vmod = r21(If - Iref)$$

$$(= Vf - Vref)$$

Figure 22A:
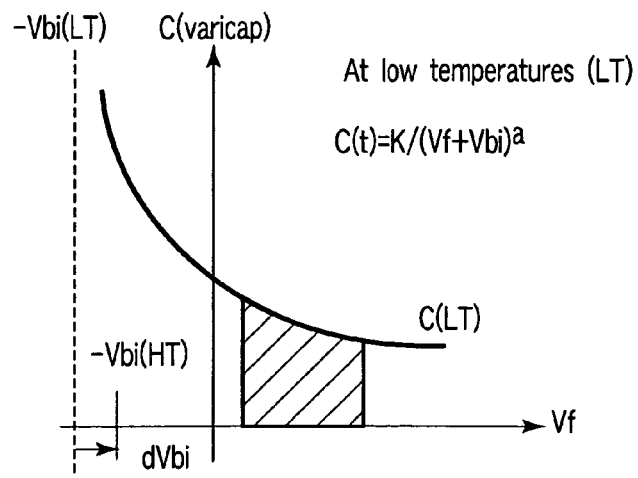
FIG. 22A is a graph showing the C-V characteristic of a voltage-variable capacitive element at low temperatures.
Figure 22B:
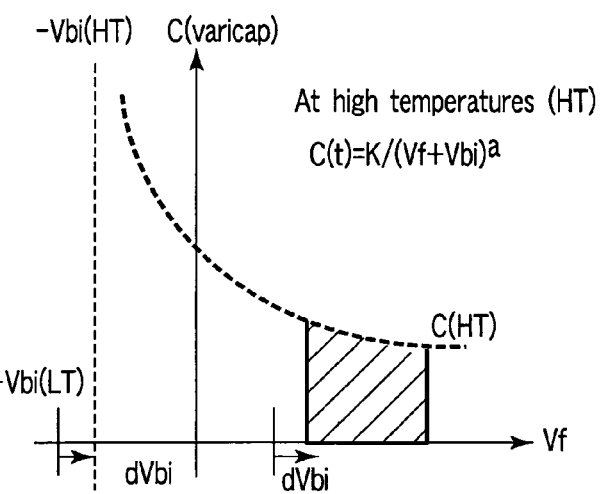
FIG. 22B is a graph showing the C-V characteristic of the voltage-variable capacitive element at high temperatures.

Hence, the operating point of the voltage-variable capacitive element remains relatively unchanged in synchronism with temperature variations in C-V characteristic (FIGS. 22A and 22B).

After the PLL is locked and output of a frequency-modulated signal RFout starts, the voltage Vmod for "1" data is set to r21 (Iref+b×Iref−If), and the voltage Vmod for "0" data is set to r21 (Iref−b×Iref−If). At this time, b is a current conversion ratio at which the temperature dependency can be substantially neglected, and satisfies 0<b<1.

A voltage fluctuation amount dV by which the frequency is modulated can be regulated to dV=±(b×r21×Iref). By using the resistor R21 having low temperature dependency, voltage fluctuations can be minimized.

[Sixth Embodiment]

Figure 23:
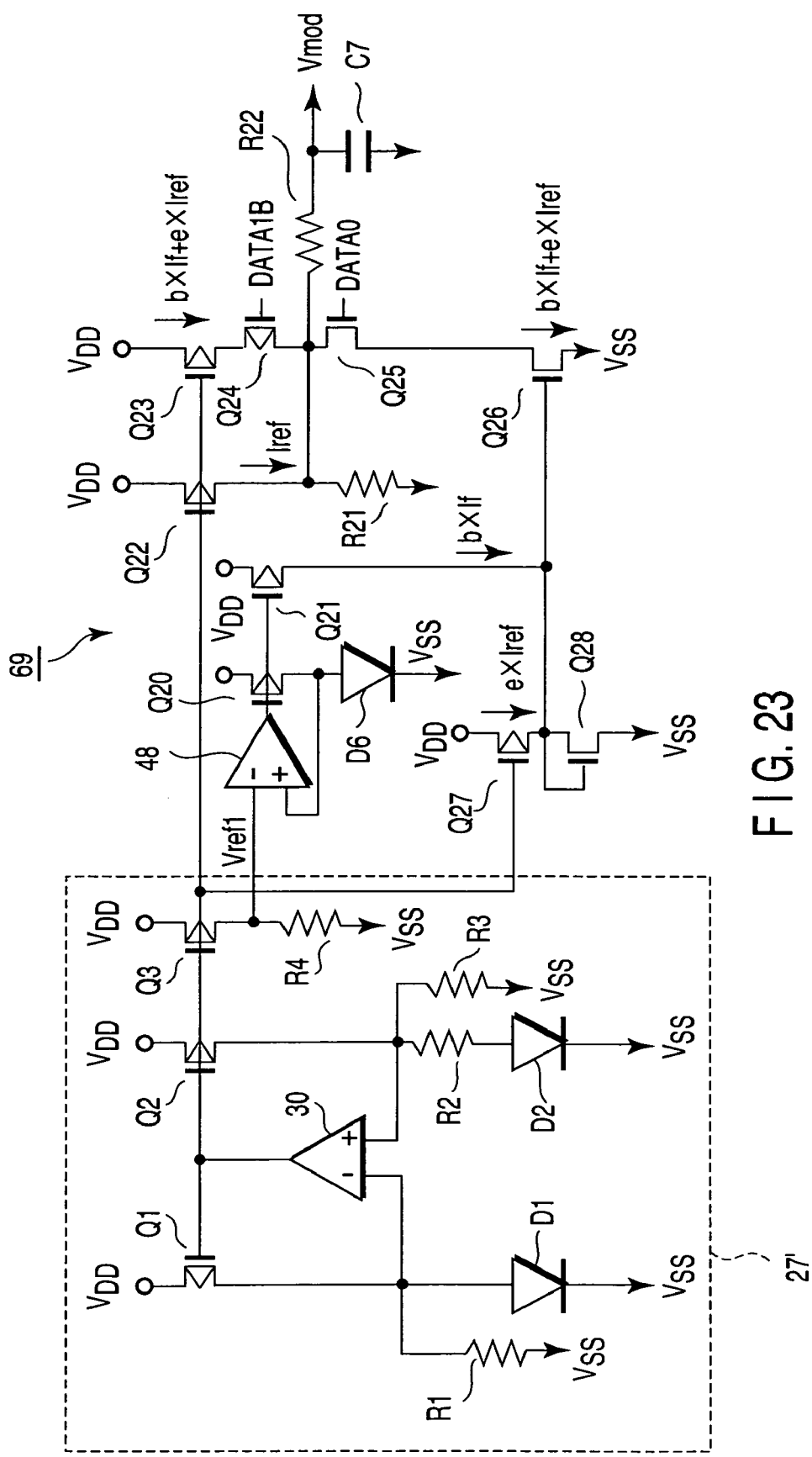
FIG. 23 is a circuit diagram showing another arrangement example of a low-pass filter shown in FIG. 21 in order to explain a direct frequency modulation apparatus and communication system according to the sixth embodiment of the present invention.

FIG. 23 shows another arrangement example of the low-pass filter shown in FIG. 21 in order to explain a direct frequency modulation apparatus and communication system according to the sixth embodiment of the present invention. In the circuit shown in FIG. 21, the resistor R21 is interposed between the drain of the MOS transistor Q21 and the ground point $V_{SS}$. In FIG. 23, a resistor R21 is interposed between the drain of a MOS transistor Q22 and the ground point $V_{SS}$. The drain of a MOS transistor Q21 is connected to the gate of a MOS transistor Q26. In this circuit arrangement, a voltage Vmod is set to a voltage whose temperature dependency is lower than that of the potential difference between the two terminals of a voltage-variable capacitive element connected to an input terminal V2 of a voltage-controlled oscillator 24. The remaining basic arrangement is the same as that in FIG. 21, the same reference numerals denote the same parts, and a detailed description thereof will be omitted.

In this circuit arrangement, a current flowing through the source-drain path of the MOS transistor Q21 is defined as b×If; a current flowing through the source-drain path of the MOS transistor Q22, as Iref; a current flowing through the source-drain path of a MOS transistor Q23, as b×If+e×Iref; a current flowing through the source-drain path of a MOS transistor Q27, as e×Iref; and a current flowing through the source-drain path of a MOS transistor Q26, as b×If+e×Iref. The resistance value of a resistor R21 is r21.

During PLL locking, the signal DATA0="L" level and the signal DATA1B="H" level, MOS transistors Q25 and Q24 are OFF, and the voltage Vmod=r21×Iref (=Vref). The operating point of the voltage-variable capacitive element relatively changes without synchronizing with temperature variations in C-V characteristic.

After the PLL is locked and output of a frequency-modulated signal RFout starts, the voltage Vmod for "1" data is set to r21 (Iref+b×If+e×Iref), and the voltage Vmod for "0" data is set to r21 (Iref−b×If−e×Iref). At this time, b and e are current conversion ratios at which the temperature dependency can be substantially neglected, and satisfy 0<b and 0≦e. The voltage fluctuation amount dV by which the frequency is modulated can be set to dV=±r21 (b×If+e×Iref). The absolute value of dV can be decreased along with temperature rise. As the resistor R21, a resistor having low temperature dependency is used. As a result, frequency modulation which compensates for the temperature dependency of the voltage-variable capacitive element can be realized.

In the fifth and sixth embodiments, the voltage-controlled oscillator 24 can adopt the same circuit arrangement as the conventional one shown in FIG. 3. Modulation voltage-variable capacitive elements Cmod1 and Cmod2 in the voltage-controlled oscillator 24 can adopt the structure shown in FIGS. 7A and 7B.

[Seventh Embodiment]

Figure 24:
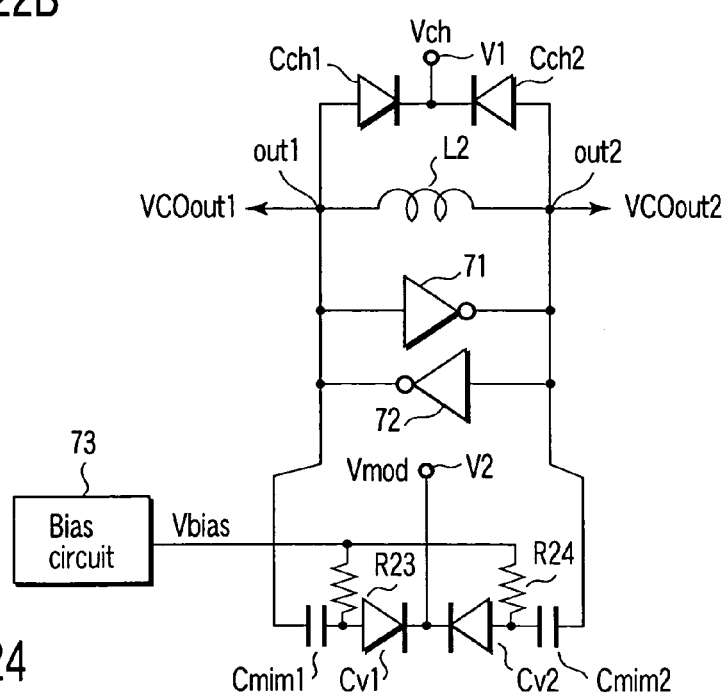
FIG. 24 is a circuit diagram showing an arrangement example of a voltage-controlled oscillator in the communication system shown in FIG. 11 in order to explain a direct frequency modulation apparatus and communication system according to the seventh embodiment of the present invention.

FIG. 24 shows an arrangement example of the voltage-controlled oscillator 24 in the communication system shown in FIG. 11 in order to explain a direct frequency modulation apparatus and communication system according to the seventh embodiment of the present invention. The voltage-controlled oscillator 24 includes channel selection voltage-variable capacitive elements (frequency channel varactor diodes or varicap diodes) Cch1 and Cch2, frequency modulation voltage-variable capacitive elements (modulation varactor diodes or varicap diodes) Cv1 and Cv2, linear capacitors Cmim1 and Cmim2, an inductance element L2, resistors R23 and R24, and inverters 71 and 72. One terminal (cathode) of each of the voltage-variable capacitive elements Cch1 and Cch2 is commonly connected to an input terminal V1, and receives a control voltage Vch (voltage corresponding to the channel frequency: e.g., 1.5 V) output from a phase-locked loop 26. The control voltage Vch is regulated to a value at which the frequency falls within a desired range even if a power supply $V_{DD}$ or temperature Temp varies.

One terminal (cathode) of each of the voltage-variable capacitive elements Cv1 and Cv2 is commonly connected to an input terminal V2, and receives a voltage Vmod output from a low-pass filter 23. The voltage Vmod finely adjusts the oscillation frequency, and is, e.g., 1.25 V. The other terminal (anode) of each of the voltage-variable capacitive elements Cv1 and Cv2 is connected to one electrode of a corresponding one of the linear capacitors Cmim1 and Cmim2 and one terminal of a corresponding one of the resistors R23 and R24. The other terminal of each of the resistors R23 and R24 receives a bias voltage Vbias from a bias circuit 73. The temperature dependency of the bias voltage Vbias output from the bias circuit 73 is approximate to that of the potential difference between the anode and cathode of the voltage-variable capacitive element Cv1, and that of the potential difference between the anode and cathode of the voltage-variable capacitive element Cv2.

By applying the bias voltage Vbias, the resistor R23 operates as a control circuit which controls potentials at one electrode of the capacitor Cmim1 and the other terminal of the voltage-variable capacitive element Cv1. The resistor R24 operates as a control circuit which controls potentials at one electrode of the capacitor Cmim2 and the other terminal of the voltage-variable capacitive element Cv2. The temperature dependency of the difference voltage between a voltage applied from the resistor R24 to one electrode of the capacitor Cmim2 and the anode of the voltage-variable capacitive element Cv2 and the bias voltage Vbias output from the bias circuit 73 is approximate to that of the potential difference between the anode and cathode of the voltage-variable capacitive element Cv1 and that of the potential difference between the anode and cathode of the voltage-variable capacitive element Cv2.

The other terminal (anode) of the voltage-variable capacitive element Cch1 and the other electrode of the linear capacitor Cmim1 are connected to an output terminal out1 which outputs the oscillation signal VCOout1. The other terminal (anode) of the voltage-variable capacitive element Cch2 and the other electrode of the linear capacitor Cmim2 are connected to an output terminal out2 which outputs the oscillation signal VCOout2.

The inductance element L2 is connected between the output terminals out1 and out2. The input terminal of the inverter 71 is connected to the output terminal out1, and the output terminal is connected to the output terminal out2. The input terminal of the inverter 72 is connected to the output terminal out2, and the output terminal is connected to the output terminal out1. Oscillation signals VCOout1 and VCOout2 output from the output terminals out1 and out2 are voltages which oscillate within a range of 0.4 to 1.2 V centered on a voltage Vcm.

In the voltage-controlled oscillator shown in FIG. 24, a potential difference Veff between the two terminals of the frequency modulation voltage-variable capacitive elements (varactor diodes) Cv1 and Cv2 is given by "Veff=Vbias−Vmod".

In this arrangement, the voltage-variable capacitive elements Cv1 and Cv2 are separated from the operating nodes out1 and out2 of the voltage-controlled oscillator 24 by the linear capacitors Cmim1 and Cmim2. The capacitance values of the voltage-variable capacitive elements Cv1 and Cv2 do not vary upon potential variations in oscillation signals VCOout1 and VCOout2.

FIG. 25 shows an arrangement example of a bias circuit 73 in the voltage-controlled oscillator 24 shown in FIG. 24. The bias circuit 73 generates a bias voltage Vbias1 having negative temperature dependency, and approximates the temperature coefficient to the C-V characteristic of the varactor diodes Cv1 and Cv2. The bias circuit 73 includes P-channel MOS transistors Q30 to Q33, N-channel MOS transistors Q34 to Q38, diodes D7, D8-1, D8-2, . . . , D8-n, resistors R25 and R35, and an operational amplifier 49.

The sources of the MOS transistors Q30 and Q31 are connected to the power supply $V_{DD}$, the gates are commonly connected, and the common gate node is connected to the drain of the MOS transistor Q31. The drains of the MOS transistors Q30 and Q31 are respectively connected to those of the MOS transistors Q34 and Q35. The gates of the MOS transistors Q34 and Q35 are commonly connected to the drain of the MOS transistor Q30.

The anode-cathode path of the diode D7 is connected between the source of the MOS transistor Q34 and a ground point $V_{SS}$. The source of the MOS transistor Q35 is connected to one terminal of the resistor R35. The anode-cathode paths of the diodes D8-1, D8-2, . . . , D8-n are parallel-connected between the other terminal of the resistor R35 and the ground point $V_{SS}$.

The source of the MOS transistor Q32 is connected to the power supply $V_{DD}$, and the gate is commonly connected to those of the MOS transistors Q30 and Q31. The drain of the MOS transistor Q32 is connected to the drain and gate of the MOS transistor Q36. The gate of the MOS transistor Q36 is commonly connected to that of the MOS transistor Q37, and the source is connected to the ground point $V_{SS}$.

This circuit is called a PTAT circuit which generates a current Iptat proportional to the temperature and supplies it to the drain-source path of the MOS transistor Q3.

The source of the MOS transistor Q33 is connected to the power supply $V_{DD}$, the drain is connected to that of the MOS transistor Q37, and the gate receives a bias voltage pbias. The source of the MOS transistor Q37 is connected to the ground point $V_{SS}$.

The common drain node between the MOS transistors Q33 and Q37 is connected to the non-inverting input terminal (+) of the operational amplifier 49. The resistor R25 is connected between the non-inverting input terminal (+) of the operational amplifier 49 and the ground point $V_{SS}$. The non-inverting input terminal (+) is connected to the gate of the MOS transistor Q38, and the source and drain of the MOS transistor Q38 are connected to the ground point $V_{SS}$. The output terminal of the operational amplifier 49 is connected to the inverting input terminal (−), and the bias voltage Vbias1 is output from the output terminal of the operational amplifier 49.

Letting Iref be a current flowing through the source-drain path of the MOS transistor Q33, and Iptat be a current flowing through the drain-source path of the MOS transistor Q37, the bias voltage Vbias1 is given by The bias circuit having this arrangement can approximate the temperature coefficient to the C-V characteristic of the varactor diodes Cv1 and Cv2.

FIG. 26 shows another arrangement example of the bias circuit 73. Similar to the bias circuit shown in FIG. 25, this bias circuit also generates a bias voltage Vbias2 having negative temperature dependency, and approximates the temperature coefficient to the C-V characteristic of the varactor diodes Cv1 and Cv2. The bias circuit 73 comprises P-channel MOS transistors Q40 to Q44, N-channel MOS transistors Q38, Q45, and Q46, a diode D10, the resistor R25, a variable resistor R26, switches SW4 and SW5, and operational amplifiers 49 and 50.

The source of the MOS transistor Q40 is connected to the power supply $V_{DD}$, the drain is connected to the anode of the diode D10 and the inverting input terminal (−) of the operational amplifier 50, and the gate receives the bias voltage pbias. The cathode of the diode D10 is connected to the ground point $V_{SS}$. The diode D10 is a P-N junction diode having the same structure as those of the varactor diodes Cv1 and Cv2.

The output terminal of the operational amplifier 50 is connected to the gates of the MOS transistors Q41 and Q42. The source of the MOS transistor Q41 is connected to the power supply $V_{DD}$, and the drain is connected to the non-inverting input terminal (+) of the operational amplifier 50. The source of the MOS transistor Q42 is connected to the power supply $V_{DD}$, and the drain is connected to the non-inverting input terminal (+) of the operational amplifier 49. The variable resistor R26 is connected between the drain of the MOS transistor Q41 and the ground point $V_{SS}$.

The switch SW4 and the drain-source path of the MOS transistor Q43 are connected between the non-inverting input terminal (+) of the operational amplifier 49 and the power supply $V_{DD}$. The gate of the MOS transistor Q43 receives the bias voltage pbias. The switch SW5 and the drain-source path of the MOS transistor Q46 are connected between the non-inverting input terminal (+) of the operational amplifier 49 and the ground point $V_{SS}$. The gate of the MOS transistor Q46 is connected to the gate and drain of the MOS transistor Q45. The drain-source path of the MOS transistor Q44 is connected between the drain of the MOS transistor Q45 and the power supply $V_{DD}$. The source of the MOS transistor Q45 is connected to the ground point $V_{SS}$, and the gate of the MOS transistor Q44 receives the bias voltage pbias. The switches SW4 and SW5 adjust the temperature dependency, and the temperature dependency can be changed by selectively turning on/off the switches SW4 and SW5.

The resistor R25 is connected between the non-inverting input terminal (+) of the operational amplifier 49 and the ground point $V_{SS}$. The non-inverting input terminal (+) is connected to the gate of the MOS transistor Q38, and the source and drain of the MOS transistor Q38 are connected to the ground point $V_{SS}$. The output terminal of the operational amplifier 49 is connected to the inverting input terminal (−), and the bias voltage Vbias2 is output from the output terminal of the operational amplifier 49.

Letting Iref be a current (e.g., 1 µA) flowing through the source-drain path of the MOS transistor Q40, and Ibias (Vf) be a current flowing through the drain-source path of the MOS transistor Q42, the bias voltage Vbias2 takes three voltage values in accordance with the switching states of the switches SW4 and SW5:

Even the bias circuit having this arrangement can approximate the temperature coefficient to the C-V characteristic of the varactor diodes Cv1 and Cv2. This bias circuit adopts the P-N junction diode D10 having the same structure as those of the varactor diodes Cv1 and Cv2, so that the temperature coefficient can be made to satisfactorily coincide with variations in C-V characteristic.

Figure 27:
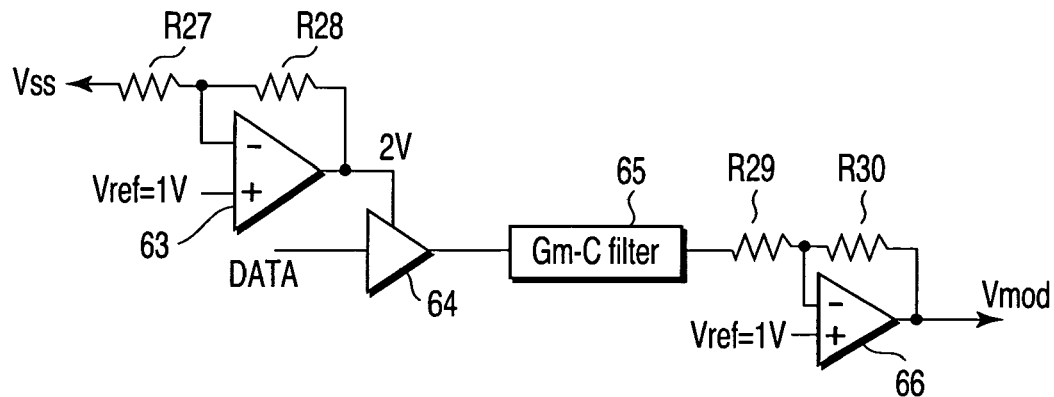
FIG. 27 is a circuit diagram showing a voltage generation circuit which applies a voltage Vmod to the voltage-controlled oscillator shown in FIG. 24.

FIG. 27 shows a voltage generation circuit which applies the voltage Vmod to the voltage-controlled oscillator 24 shown in FIG. 24. The voltage generation circuit includes resistors R27 to R30, operational amplifiers 63 and 66, a buffer 64, and a filter (Gm-C filter) 65. The filter 65 corresponds to a circuit portion which is formed by the gm amplifiers 46-1 to 46-5 and the capacitive elements C1 to C6 in the circuit shown in FIG. 18.

Transmission data DATA is input to the buffer 64, amplified by it, and supplied to the filter 65. The buffer 64 receives an output voltage (e.g., 2 V) from the operational amplifier 63 as a power supply voltage. The non-inverting input terminal (+) of the operational amplifier 63 receives a reference voltage Vref (e.g., 1 V), and the resistor R28 is connected between the output terminal and the inverting input terminal (−). The resistor R27 is connected between the inverting input terminal (−) of the operational amplifier 63 and the ground point $V_{SS}$.

The output terminal of the filter 65 is connected to one terminal of the resistor R29. The other terminal of the resistor R29 is connected to the inverting input terminal (−) of the operational amplifier 66. The non-inverting input terminal (+) of the operational amplifier 66 receives the reference voltage Vref (e.g., 1 V), and the resistor R30 is connected between the output terminal and the inverting input terminal (−). The voltage Vmod is output from the output terminal of the operational amplifier 66.

The output voltage Vmod from the voltage generation circuit has a voltage waveform with a predetermined amplitude that uses as a reference the reference voltage Vref with no (or low) temperature dependency.

In the above description, the temperature dependency of the C-V characteristic of the varactor diodes Cv1 and Cv2 is compensated by reducing the temperature dependency of the voltage Vmod and giving temperature dependency to the bias voltage Vbias. The temperature dependency may be given to the voltages Vmod and Vbias, and the difference voltage may compensate for the temperature dependency of the C-V characteristic. Alternatively, the temperature dependency may be given to only the voltage Vmod without giving the temperature dependency to the bias voltage Vbias.

[Eighth Embodiment]

Figure 28:
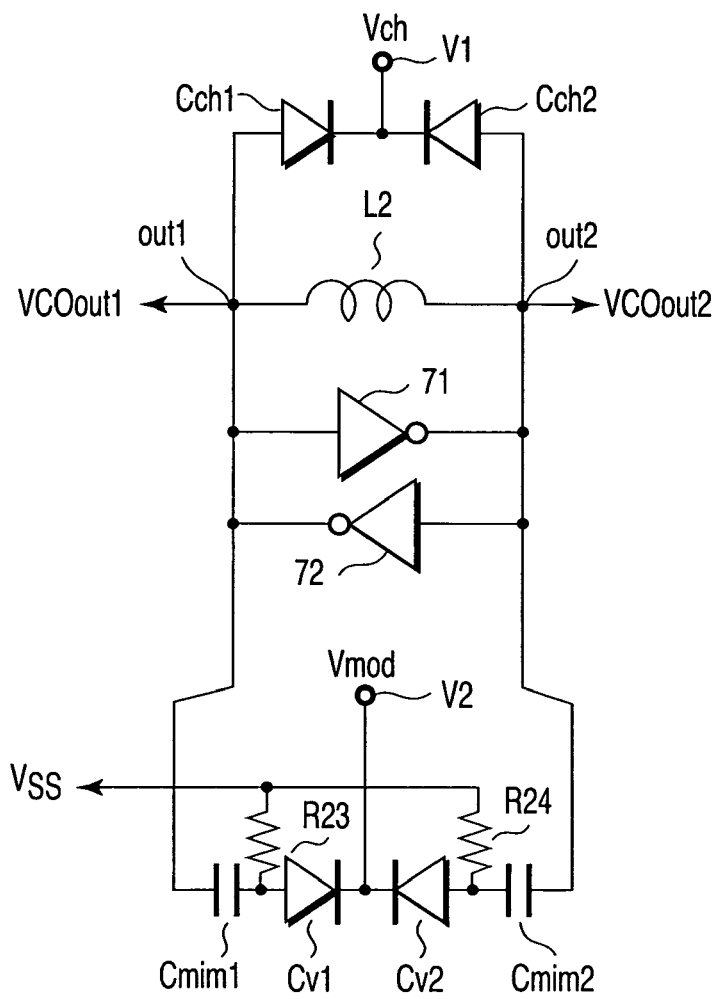
FIG. 28 is a circuit diagram showing another arrangement example of the voltage-controlled oscillator in the communication system shown in FIG. 11 in order to explain a direct frequency modulation apparatus and communication system according to the eighth embodiment of the present invention.

FIG. 28 shows another arrangement example of the voltage-controlled oscillator 24 in the communication system shown in FIG. 11 in order to explain a direct frequency modulation apparatus and communication system according to the eighth embodiment of the present invention. The circuit shown in FIG. 28 is different from that shown in FIG. 24 in that the other end of each of resistors R23 and R24 is connected to a ground point $V_{SS}$. In other words, a bias voltage Vbias is set to a ground potential. The remaining circuit arrangement is the same as the circuit shown in FIG. 24, the same reference numerals denote the same parts, and a detailed description thereof will be omitted.

In the voltage-controlled oscillator shown in FIG. 28, a potential difference Veff between the two terminals of frequency modulation voltage-variable capacitive elements (varactor diodes) Cv1 and Cv2 is given by "Veff=Vmod−$V_{SS}$ ($V_{SS}$−Vmod)".

Figure 29:
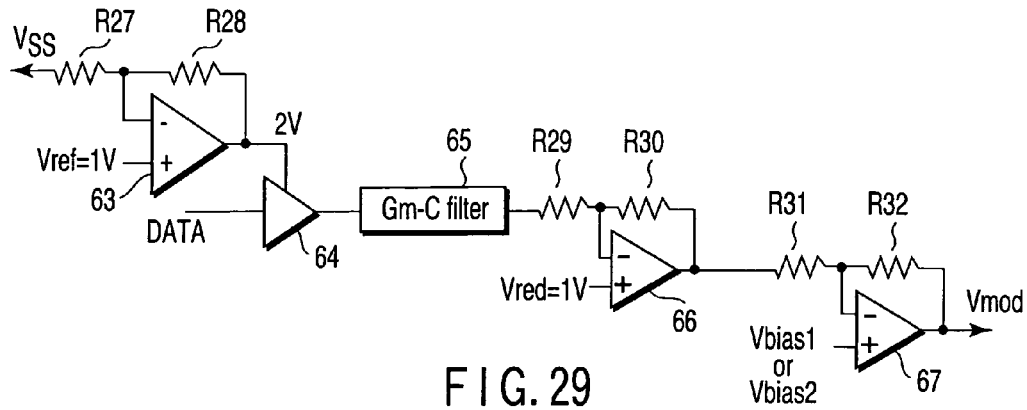
FIG. 29 is a circuit diagram showing an arrangement example of a voltage generation circuit which applies the voltage Vmod to the voltage-controlled oscillator shown in FIG. 28.

FIG. 29 shows a voltage generation circuit which applies the voltage Vmod to a voltage-controlled oscillator 24 shown in FIG. 28. An output voltage Vbias1 or Vbias2 from the bias circuit shown in FIG. 25 or 26 is applied to the reference voltage of an amplification circuit (operational amplifier) on the final stage, thus generating a temperature-compensated voltage Vmod.

In the voltage generation circuit, resistors R31 and R32 and an operational amplifier 67 are added to the output stage of the circuit shown in FIG. 27 to give temperature dependency. An arrangement up to generation of a voltage by supplying an output from a filter 65 to an operational amplifier 66 is the same as that of the circuit shown in FIG. 27, the same reference numeral denote the same parts, and a detailed description thereof will be omitted.

The output terminal of the operational amplifier 66 is connected to one terminal of the resistor R31, and the other terminal of the resistor R31 is connected to the inverting input terminal (−) of the operational amplifier 67. The non-inverting input terminal (+) of the operational amplifier 67 receives the bias voltage Vbias1 or Vbias2 output from the bias circuit shown in FIG. 25 or 26. The resistor R32 is connected between the output terminal and inverting input terminal (−) of the operational amplifier 67, and the voltage Vmod is output from the output terminal.

The voltage generation circuit shown in FIG. 27 outputs the output voltage Vmod with a predetermined amplitude that uses as a reference the reference voltage Vref with no (or low) temperature dependency. To the contrary, the voltage generation circuit having the above arrangement outputs the voltage Vmod with negative temperature dependency by using the bias voltages Vbias1 and Vbias2 with negative temperature dependency. The voltage Vmod having negative temperature dependency is applied to the voltage-controlled oscillator 24. Accordingly, variations in the frequencies of oscillation signals VCOout1 and VCOout2 output from the voltage-controlled oscillator 24 can be suppressed by changing the voltage Vmod when the modulation frequency varies depending on the temperature.

Similar to the above-described embodiments, this arrangement can also suppress noise to an adjacent communication channel upon temperature variations in modulation frequency.

[Ninth Embodiment]

Figure 30A:
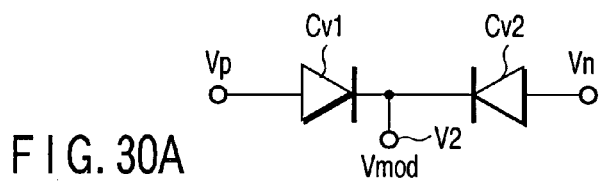
FIG. 30A is a circuit diagram showing another arrangement example of the voltage-variable capacitive element used in the low-pass filter in the circuits shown in FIGS. 24 and 28.
Figure 30B:
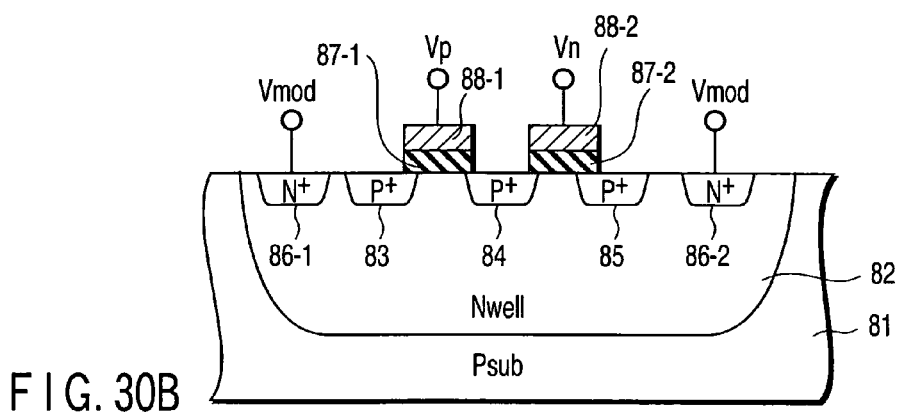
FIG. 30B is a sectional view of the circuit shown in FIG. 30A.

FIGS. 30A and 30B show an arrangement example of the voltage-variable capacitive elements Cv1 and Cv2 used in the voltage-controlled oscillator shown in FIGS. 24 and 28. FIG. 30A is a circuit diagram, and FIG. 30B is a sectional view. Voltage-variable capacitive elements Cv1 and Cv2 utilize the C-V characteristic of a MOS capacitor. That is, an N-type well region (Nwell) 82 is formed in a P-type semiconductor substrate (Psub) 81. $P^+$-type impurity diffusion regions 83, 84, and 85 and $N^+$-type impurity diffusion regions 86-1 and 86-2 which operate as the source and drain regions of MOS transistors are formed in the well region 82. A gate insulating film 87-1 is formed on the substrate 81 between the source and drain regions 83 and 84, and a gate electrode 88-1 is formed on the gate insulating film 87-1. A gate insulating film 87-2 is formed on the substrate 81 between the source and drain regions 84 and 85, and a gate electrode 88-2 is formed on the gate insulating film 87-2. A voltage Vmod is applied to the impurity diffusion regions 86-1 and 86-2.

Figure 31:
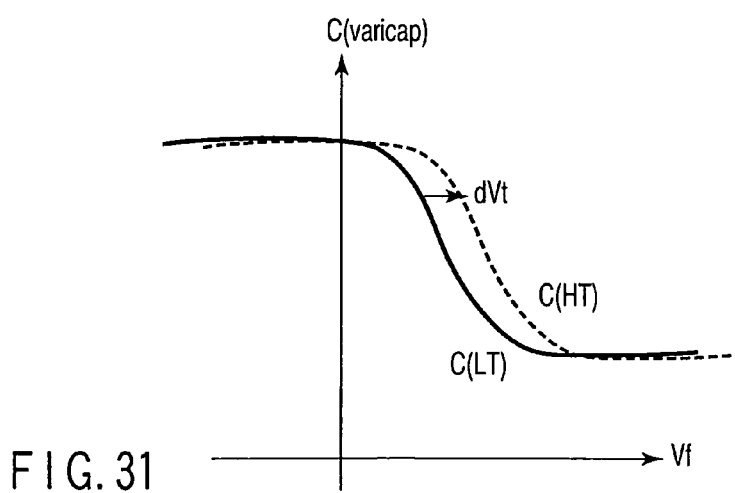
FIG. 31 is a graph showing the C-V characteristic of a MOS capacitor shown in FIGS. 30A and 30B.

FIG. 31 is a graph showing the C-V characteristic of the MOS capacitor shown in FIGS. 30A and 30B. As shown in FIG. 31, the C-V characteristic shifts (by a shift amount dVt) from a solid line C(LT) to a broken line C(HT) along with temperature rise.

In the use of the MOS capacitor shown in FIGS. 30A and 30B, a voltage-variable capacitive element cannot be used as D5 used in the circuit of FIG. 16A. In this case, for example, the resistor R16 in FIG. 16B must be a resistor having a trimming function, thereby reducing variations in the manufacture.

Figure 7B:
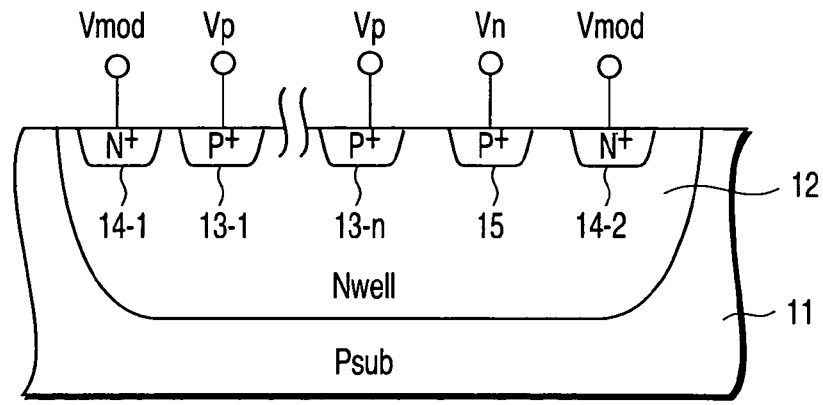
FIG. 7B is a sectional view of the circuit shown in FIG. 7A.

The varactor diodes (voltage-variable capacitive elements) Cv1 and Cv2 may be P-N junction diodes as shown in FIG. 7B, instead of the MOS capacitors. In this case, the influence of variations in the manufacture can be substantially neglected.

[10th Embodiment]

Figure 32:
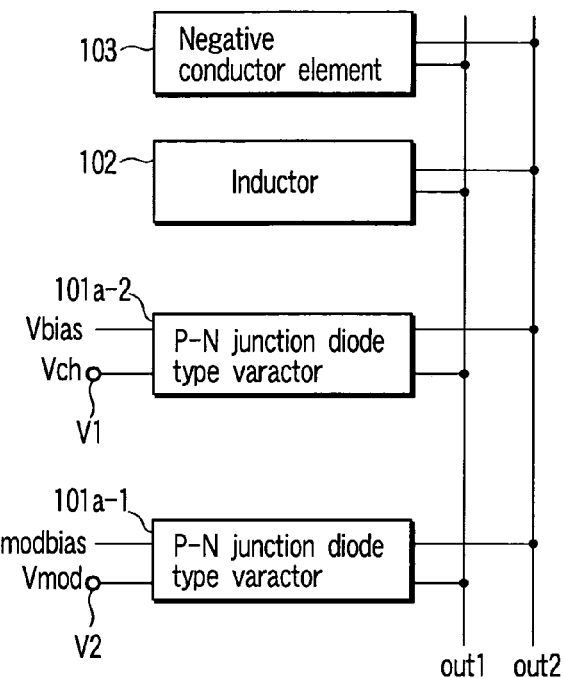
FIG. 32 is a block diagram showing still another arrangement example of the voltage-controlled oscillator in order to explain a direct frequency modulation apparatus and communication system according to the 10th embodiment of the present invention.

FIGS. 32 to 36B are views for explaining a direct frequency modulation apparatus and communication system according to the 10th embodiment of the present invention. FIG. 32 is a block diagram showing still another arrangement example of the voltage-controlled oscillator. This voltage-controlled oscillator includes P-N junction diode type varactors (for frequency modulation and channel selection) 101a-1 and 101a-2, an inductor 102, and a negative conductor element 103 which replenishes an LC tank with electromagnetic energy consumed by the LC tank.

Figure 33:
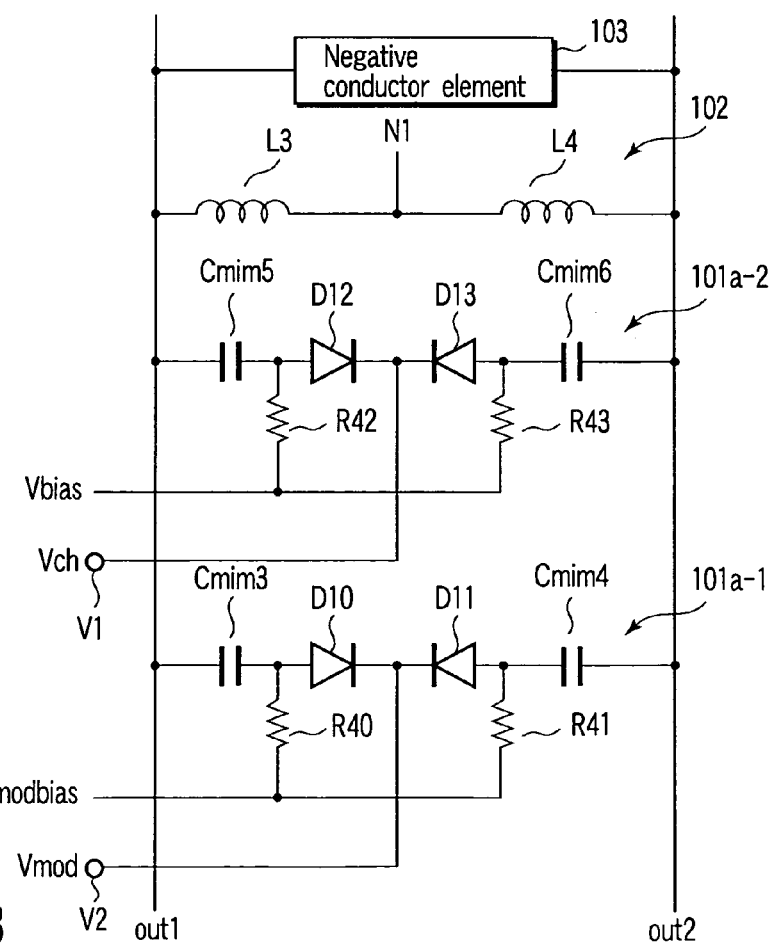
FIG. 33 is a circuit diagram showing a detailed arrangement example of the voltage-controlled oscillator shown in FIG. 32.

FIG. 33 is a circuit diagram showing a detailed arrangement example of the voltage-controlled oscillator shown in FIG. 32. The frequency modulation varactor 101a-1 includes P-N junction diodes D10 and D11, linear capacitors Cmim3 and Cmim4, and resistors R40 and R41. The cathodes of the diodes D10 and D11 are commonly connected to an input terminal V2. The anode of each of the diodes D10 and D11 is connected to one electrode of a corresponding one of the capacitors Cmim3 and Cmim4, and the other electrode of each of the capacitors Cmim3 and Cmim4 is connected to a corresponding one of output terminals out1 and out2. The anode of each of the diodes D10 and D11 is connected to one terminal of a corresponding one of the resistors R40 and R41, and the other terminal of each of the resistors R40 and R41 receives a bias voltage Vmodbias. The resistor R40 operates as a control circuit which controls potentials at one electrode of the capacitor Cmim3 and the anode of the diode D10. The resistor R41 operates as a control circuit which controls potentials at one electrode of the capacitor Cmim4 and the anode of the diode D11.

The channel selection varactor 1011a-2 also has the same circuit arrangement as that of the frequency modulation varactor 101a-1. The varactor 101a-2 includes P-N junction diodes D12 and D13, linear capacitors Cmim5 and Cmim6, and resistors R42 and R43. The cathodes of the diodes D12 and D13 are commonly connected to an input terminal V1. The anode of each of the diodes D12 and D13 is connected to one electrode of a corresponding one of the capacitors Cmim5 and Cmim6, and the other electrode of each of the capacitors Cmim5 and Cmim6 is connected to a corresponding one of the output terminals out1 and out2. The anode of each of the diodes D12 and D13 is connected to one terminal of a corresponding one of the resistors R42 and R43, and the other terminal of each of the resistors R42 and R43 receives a bias voltage Vbias. The resistor R42 operates as a control circuit which controls potentials at one electrode of the capacitor Cmim5 and the anode of the diode D12. The resistor R43 operates as a control circuit which controls potentials at one electrode of the capacitor Cmim6 and the anode of the diode D13.

The inductor 102 is formed by inductance elements L3 and L4. The inductance element L3 is connected between the output terminal out1 and a node N1, and the inductance element L4 is connected between the node N1 and the output terminal out2. The node N1 may be connected to the power supply or ground, or floated.

The negative conductor element 103 is constituted as shown in, e.g., FIGS. 34A to 34C. The negative conductor element 103 in FIG. 34A is called a CMOS element which is formed by two inverters 110 and 111. The input terminal of the inverter 110 is connected to an output terminal out1, and the output terminal is connected to an output terminal out2. The input terminal of the inverter 111 is connected to the output terminal out2, and the output terminal is connected to the output terminal out1.

The negative conductor element 103 in FIG. 34B is called an NMOS element which is formed by a pair of N-channel MOS transistors Q50 and Q51. The drain of the MOS transistor Q50 is connected to the output terminal out1, the source is connected to a ground point $V_{SS}$, and the gate is connected to the output terminal out2. The drain of the MOS transistor Q51 is connected to the output terminal out2, the source is connected to the ground point $V_{SS}$, and the gate is connected to the output terminal out1.

The negative conductor element 103 in FIG. 34C is called a PMOS element which is formed by a pair of P-channel MOS transistors Q52 and Q53. The source of the MOS transistor Q52 is connected to a power supply $V_{DD}$, the drain is connected to the output terminal out1, and the gate is connected to the output terminal out2. The source of the MOS transistor Q53 is connected to the power supply $V_{DD}$, the drain is connected to the output terminal out2, and the gate is connected to the output terminal out1.

In this arrangement, the bias voltages Vbias and Vmodbias have temperature dependency such that the temperature dependencies of their frequencies fall within a desired value. The bias voltage Vbias can be generated by, e.g., the bias circuit shown in FIG. 25 or 26. The bias voltage Vbias can be more simply generated by a bias circuit as shown in FIG. 35. The circuit shown in FIG. 35 is comprised of a current source 112 and P-N junction diode D14. The current source 112 is connected to the power supply $V_{DD}$, and supplies a current to the anode of the diode D14. The cathode of the P-N junction diode D14 is connected to the ground point $V_{SS}$, and the anode of the diode D14 outputs the bias voltage Vbias. Since the voltage-controlled oscillator uses a P-N junction diode, an identical element is desirably adopted.

The bias voltage Vmodbias is obtained by applying an output voltage from, e.g., the bias circuit shown in FIGS. 25, 26, or 35 to, e.g., the voltage generation circuit shown in FIG. 27 or 29, and giving temperature dependency to the control voltage Vmod.

FIGS. 36A and 36B show the temperature dependency of the C-V characteristic of the varactor and the I-V characteristic of the bias circuit. As shown in FIG. 36A, the C-V characteristic approximately parallel-moves in the lateral direction together with the temperature. A change voltage dV is compensated by the bias voltage. As shown in FIG. 36B, the temperature variation voltage changes depending on the operating current. Desired compensation can be achieved by operation at a bias current which provides dV.

[11th Embodiment]

FIGS. 37 to 41B are views for explaining a direct frequency modulation apparatus and communication system according to the 11th embodiment of the present invention. FIG. 37 is a block diagram showing still another arrangement example of the voltage-controlled oscillator. This voltage-controlled oscillator includes MOS varactors (for frequency modulation and channel selection) 101b-1 and 101b-2, an inductor 102, and a negative conductor element 103 which replenishes an LC tank with electromagnetic energy consumed by the LC tank.

FIG. 38 is a circuit diagram showing a detailed arrangement example of the voltage-controlled oscillator shown in FIG. 37. The frequency modulation varactor 101b-1 includes P-channel MOS transistors Q54 and Q55, linear capacitors Cmim3 and Cmim4, and resistors R40 and R41. The back gates of the MOS transistors Q54 and Q55 are commonly connected to an input terminal V2. The gate of each of the MOS transistors Q54 and Q55 is connected to one electrode of a corresponding one of the capacitors Cmim3 and Cmim4, and the other electrode of each of the capacitors Cmim3 and Cmim4 is connected to a corresponding one of output terminals out1 and out2. The gate of each of the MOS transistors Q54 and Q55 is connected to one terminal of a corresponding one of the resistors R40 and R41, and the other terminal of each of the resistors R40 and R41 receives a bias voltage Vmodbias. The resistor R40 operates as a control circuit which controls potentials at one electrode of the capacitor Cmim3 and the gate of the MOS transistor Q54. The resistor R41 operates as a control circuit which controls potentials at one electrode of the capacitor Cmim4 and the gate of the MOS transistor Q55.

The channel selection varactor 101b-2 also has the same circuit arrangement as that of the frequency modulation varactor 101b-1. The varactor 101b-2 includes MOS transistors Q56 and Q57, linear capacitors Cmim5 and Cmim6, and resistors R42 and R43. The back gates of the MOS transistors Q56 and Q57 are commonly connected to an input terminal V1. The gate of each of the MOS transistors Q56 and Q57 is connected to one electrode of a corresponding one of the capacitors Cmim5 and Cmim6, and the other electrode of each of the capacitors Cmim5 and Cmim6 is connected to a corresponding one of the output terminals out1 and out2. The gate of each of the MOS transistors Q56 and Q57 is connected to one terminal of a corresponding one of the resistors R42 and R43, and the other terminal of each of the resistors R42 and R43 receives a bias voltage Vbias. The resistor R42 operates as a control circuit which controls potentials at one electrode of the capacitor Cmim5 and the gate of the MOS transistor Q56. The resistor R43 operates as a control circuit which controls potentials at one electrode of the capacitor Cmim6 and the gate of the MOS transistor Q57. The MOS transistors Q54 to Q57 are used as capacitors, and the sources and drains are floated. Alternatively, merely MOS capacitors may be constituted without forming any source and drain.

The inductor 102 is comprised of inductance elements L3 and L4. The inductance element L3 is connected between the output terminal out1 and a node N1, and the inductance element L4 is connected between the node N1 and the output terminal out2. The node N1 may be connected to the power supply or ground, or floated.

The negative conductor element 103 is constituted as shown in, e.g., FIGS. 34A to 34C.

Figure 39A:
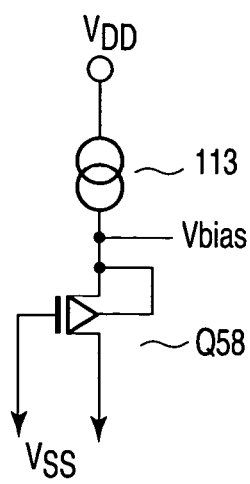
FIG. 39A is a circuit diagram showing an arrangement example of a bias circuit which applies the bias voltage to the voltage-controlled oscillator shown in FIGS. 37 and 38.
Figure 39B:
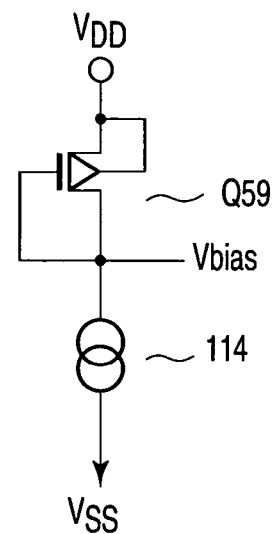
FIG. 39B is a circuit diagram showing another arrangement example of the bias circuit which applies the bias voltage to the voltage-controlled oscillator shown in FIGS. 37 and 38.

In this arrangement, the bias voltages Vbias and Vmodbias have temperature dependency such that the temperature dependencies of their frequencies fall within a desired value. The bias voltages Vbias and Vmodbias can be generated by, e.g., the bias circuit shown in FIG. 25 or 26. The bias voltages Vbias and Vmodbias can be more simply generated by a circuit as shown in FIGS. 39A and 39B. The bias circuit shown in FIG. 39A is comprised of a current source 113 and P-channel MOS transistor Q58. The current source 113 is connected to the power supply $V_{DD}$, and supplies a current to the source of the MOS transistor Q58. The drain and gate of the MOS transistor Q58 are connected to the ground point $V_{SS}$, and the source of the MOS transistor Q58 outputs the bias voltage Vbias.

The bias circuit shown in FIG. 39B is comprised of a current source 114 and P-channel MOS transistor Q59. The source of the MOS transistor Q59 is connected to the power supply $V_{DD}$, and the current source 114 is connected between the drain and gate of the MOS transistor Q59 and the ground point $V_{SS}$. The bias voltage Vbias is output from the node between the drain of the MOS transistor Q59 and the current source 114. Since the voltage-controlled oscillator uses a MOS transistor, an identical element is desirably adopted.

In FIGS. 39A and 39B, the back gates of the MOS transistors Q58 and Q59 are respectively connected to their own sources.

Figure 40A:
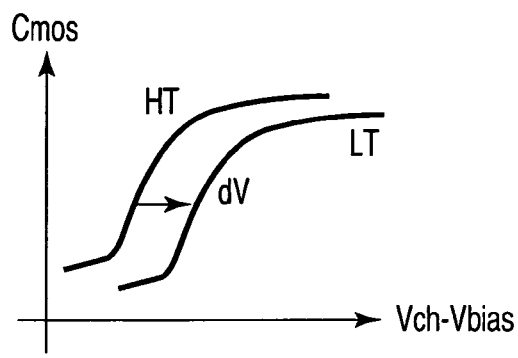
FIG. 40A is a graph showing the temperature dependency of the C-V characteristic in a varactor diode in the use of the bias circuit shown in FIG. 39A.
Figure 40B:
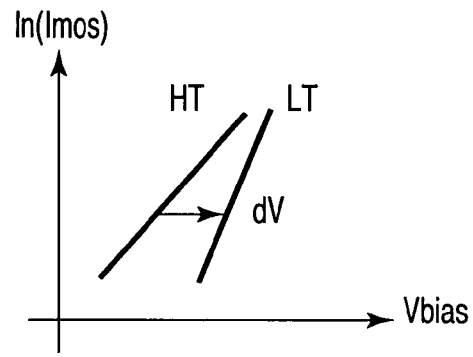
FIG. 40B is a graph showing the I-V characteristic of the bias circuit in the use of the bias circuit shown in FIG. 39A.
Figure 41A:
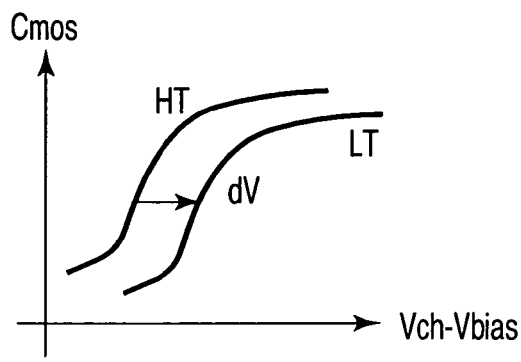
FIG. 41A is a graph showing the temperature dependency of the C-V characteristic in the varactor diode in the use of the bias circuit shown in FIG. 39B.
Figure 41B:
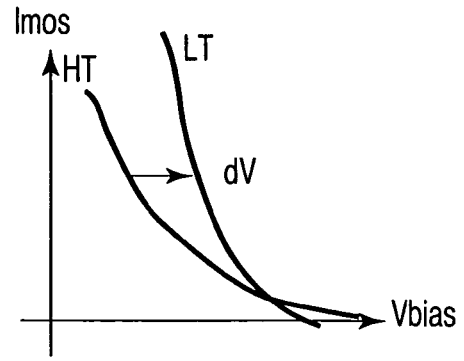
FIG. 41B is a graph showing the I-V characteristic of the bias circuit in the use of the bias circuit shown in FIG. 39B.

FIGS. 40A and 40B, and FIG. 41A and 41B show the temperature dependency of the C-V characteristic of the varactor and the I-V characteristic of the bias circuit in the use of the bias circuits shown in FIGS. 39A and 39B, respectively. As shown in FIG. 40A, the C-V characteristic approximately parallel-moves in the lateral direction together with the temperature. A change voltage dV is compensated by the bias voltage. As shown in FIG. 39B, the temperature variation voltage changes depending on the operating current. Desired compensation can be achieved by operation at a bias current which provides dV.

[12th Embodiment]

FIGS. 42 and 43 are a block diagram and circuit diagram, respectively, showing still another arrangement example of the voltage-controlled oscillator in order to explain a direct frequency modulation apparatus and communication system according to the 12th embodiment of the present invention. The voltage-controlled oscillator shown in FIG. 42 includes a MOS varactor (for frequency modulation) 101b, a P-N junction diode type varactor (for channel selection) 101a, an inductor 102, and a negative conductor element 103 which replenishes an LC tank with electromagnetic energy consumed by the LC tank.

In the 12th embodiment, the MOS varactor (for frequency modulation) 101b in the 10th and 11th embodiments and the P-N junction diode type varactor (for channel selection) 101a are combined. The same reference numerals denote the same parts, and a detailed description thereof will be omitted.

Even with this arrangement, the voltage-controlled oscillator performs the same operation as those of the voltage-controlled oscillators described in the 10th and 11th embodiments, and the same effects can be obtained.

[13th Embodiment]

FIGS. 44 and 45 are a block diagram and circuit diagram, respectively, showing still another arrangement example of the voltage-controlled oscillator in order to explain a direct frequency modulation apparatus and communication system according to the 13th embodiment of the present invention. The voltage-controlled oscillator shown in FIG. 44 includes a P-N junction diode type varactor (for channel selection) 101a, a MOS varactor (for frequency modulation) 101b, an inductor 102, and a negative conductor element 103 which replenishes an LC tank with electromagnetic energy consumed by the LC tank.

In the 13th embodiment, similar to the 12th embodiment, the MOS varactor (for frequency modulation) 101b and P-N junction diode type varactor (for channel selection) 101a in the 10th and 11th embodiments are combined. The same reference numerals denote the same parts, and a detailed description thereof will be omitted.

Even with this arrangement, the voltage-controlled oscillator performs the same operation as those of the voltage-controlled oscillators described in the 10th to 12th embodiments, and the same effects can be obtained.

In the 10th to 13th embodiments, the other terminal of each of the resistors R40 and R41 may be grounded to supply the ground potential as the bias voltage Vmodbias. Similarly, the other terminal of each of the resistors R42 and R43 may be grounded to supply the ground potential as the bias voltage Vbias. Both the bias voltages Vmodbias and Vbias may be set to the ground potential.

Also, one bias circuit may apply the bias voltages Vmodbias and Vbias.

The above-described embodiments are summarized in Table 1.

Vmod is so determined as to suppress the temperature dependency of frequency modulation of Vmod+dVmod.

In Case 3, the change amount dVmod for a temperature change is given a small temperature dependency value on the assumption that the voltage Vmod (in PLL locking) is set to a value corresponding to the temperature dependencies of the voltage-variable capacitive elements Cv1 and Cv2. The temperature dependency of the voltage Vmod is so determined as to suppress the temperature dependency of frequency modulation of Vmod+dVmod.

In Case 4, the change amount dVmod for a temperature change is given temperature dependency on the assumption that the voltage Vmod (in PLL locking) has a small temperature dependency value. The temperature dependency of frequency modulation of Vmod+dVmod is suppressed.

In addition to these cases, the temperature dependencies of Vmod and dVmod can be individually so set as to suppress the temperature dependency of frequency modulation of Vmod+dVmod.

In Case 5, the frequency modulation voltage-variable capacitive element in the voltage-controlled oscillator is separated from the operating node (output terminal) of the voltage-controlled oscillator by the linear capacitor.

In Case 6, both the channel selection voltage-variable capacitive element and frequency modulation voltage-variable capacitive element in the voltage-controlled oscillator are separated from the operating node (output terminal) of the voltage-controlled oscillator by the linear capacitor.

The seventh to 13th embodiments in Case 5 and Case 6 are not always applied singly, but can be combined with any of the first to sixth embodiments in Case 1 to Case 4, as needed.

As has been described above, the direct frequency modulation apparatus according to the embodiments of the present invention can approximate the modulation voltage applied to the voltage-variable capacitive element to the temperature dependency of the C-V characteristic, thereby suppressing temperature variations in modulation frequency. The direct frequency modulation apparatus can suppress variations in oscillation frequency by separating the frequency modulation voltage-variable capacitive element in the voltage-controlled oscillator from the operating node (output terminal) of the voltage-controlled oscillator by the capacitor. Also, the direct frequency modulation apparatus can suppress variations in oscillation frequency by separating the channel selection voltage-variable capacitive element and

TABLE 1

| | | Vmod (PLL locking) | dVmod (Frequency modulation) |
|---|---|---|---|
| Case 1 | First and second embodiments | Vx (dVx/dT > \|dVf/dT\|) | b × Vx (b < 1) |
| Case 2 | Third embodiment | b × Vf + Vref (b < −1) | e × (b × Vx + Vref) |
| Case 3 | Fifth embodiment | Vf − Vref | b × Vref |
| Case 4 | Sixth embodiment | Vref | b × Vf + e × Vref (b > 0, e ≧ 0) |
| Case 5 | Seventh and eight embodiments | Frequency modulation voltage-variable capacitive element of VCO is separated from operating node by linear capacitor | |
| Case 6 | Ninth to 13th embodiments | Channel selection voltage-variable capacitive element and frequency modulation voltage-variable capacitive element of VCO are separated from operating node by linear capacitor | | where dVref/dT << dVf/dT

In Case 1 and Case 2, the temperature dependency of the voltage Vmod is set higher than Vf on the assumption that the voltage Vmod (in PLL locking) and the change amount dVmod for a temperature change in voltage are proportional to each other. The temperature dependency of the voltage frequency modulation voltage-variable capacitive element in the voltage-controlled oscillator from the operating node (output terminal) of the voltage-controlled oscillator by the capacitor. As a result, noise to an adjacent communication channel can be suppressed.

According to one aspect of the present invention, there is provided a direct frequency modulation apparatus and communication system capable of suppressing noise to an adjacent communication channel upon temperature variations in modulation frequency.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A direct frequency modulation apparatus comprising:
   a voltage-controlled oscillator which comprises a first voltage-variable capacitive circuit that is so constituted as to change a capacitance value by a first voltage applied to a first control terminal, and a second voltage-variable capacitive circuit that is so constituted as to change a capacitance value by a second voltage applied to a second control terminal, and oscillates at frequencies corresponding to the first and second voltages applied to the first and second control terminals;
   a phase-locked loop which is connected to the first control terminal, locks an oscillation frequency of the voltage-controlled oscillator to a predetermined frequency, and then holds the first voltage applied to the first control terminal; and
   a voltage generation circuit which is connected to the second control terminal, applies the second voltage to the second control terminal during a locking period of the phase-locked loop, and after the locking period of the phase-locked loop, generates a modulation voltage obtained by changing the second voltage by a third voltage in accordance with input data, the second voltage being applied to the second control terminal,
   wherein temperature dependency of the second voltage is higher than temperature dependency of a potential difference between two terminals of an element which provides a capacitance value in the second voltage-variable capacitive circuit.

2. An apparatus according to claim 1, wherein the third voltage is proportional to the second voltage.

3. An apparatus according to claim 1, wherein the voltage generation circuit comprises a low-pass filter having a reference voltage generation circuit which generates the second voltage having positive temperature dependency, a digital-to-analog converter which increases or decreases the second voltage output from the reference voltage generation circuit by the third voltage in accordance with the input data and outputs the second voltage, and a filter which receives the voltage output from the digital-to-analog converter and outputs the modulation voltage.

4. An apparatus according to claim 1, wherein the first voltage includes a voltage which sets a channel frequency, and the second voltage includes a voltage which has positive temperature dependency and increases or decreases by the third voltage in accordance with the input data.

5. A direct frequency modulation apparatus comprising:
   a voltage-controlled oscillator which comprises a first voltage-variable capacitive circuit that is so constituted as to change a capacitance value by a first voltage applied to a first control terminal, and a second voltage-variable capacitive circuit that is so constituted as to change a capacitance value by a second voltage applied to a second control terminal, and oscillates at frequencies corresponding to the first and second voltages applied to the first and second control terminals;
   a phase-locked loop which is connected to the first control terminal, locks an oscillation frequency of the voltage-controlled oscillator to a predetermined frequency, and then holds the first voltage applied to the first control terminal; and
   a voltage generation circuit which is connected to the second control terminal, applies the second voltage to the second control terminal during a locking period of the phase-locked loop, and after the locking period of the phase-locked ioop, generates a modulation voltage obtained by changing the second voltage by a third voltage in accordance with input data, the second voltage being applied to the second control terminal,
   wherein the second voltage is given by a difference between a fourth voltage whose temperature dependency is lower than temperature dependency of a potential difference between two terminals of an element which provides a capacitance value in the second voltage-variable capacitive circuit, and a fifth voltage proportional to the potential difference between the two terminals of the element.

6. An apparatus according to claim 5, wherein the third voltage is proportional to the second voltage.

7. An apparatus according to claim 5, wherein the voltage generation circuit comprises a low-pass filter having a band gap reference circuit, a temperature compensation voltage generation circuit which generates the second voltage by giving positive temperature dependency to a reference voltage output from the band gap reference circuit, a digital-to-analog converter which increases or decreases the second voltage output from the temperature compensation voltage generation circuit by the third voltage in accordance with the input data and outputs the second voltage, and a filter which receives the voltage output from the digital-to-analog converter and outputs the modulation voltage.

8. An apparatus according to claim 5, wherein the first voltage includes a voltage which sets a channel frequency, and the second voltage includes a voltage which has positive temperature dependency and increases or decreases by the third voltage in accordance with the input data.

9. A direct frequency modulation apparatus comprising:
   a voltage-controlled oscillator which comprises a first voltage-variable capacitive circuit that is so constituted as to change a capacitance value by a first voltage applied to a first control terminal, and a second voltage-variable capacitive circuit that is so constituted as to change a capacitance value by a second voltage applied to a second control terminal, and oscillates at frequencies corresponding to the first and second voltages applied to the first and second control terminals;
   a phase-locked loop which is connected to the first control terminal, locks an oscillation frequency of the voltage-controlled oscillator to a predetermined frequency, and then holds the first voltage applied to the first control terminal; and
   a voltage generation circuit which is connected to the second control terminal, applies the second voltage to the second control terminal during a locking period of the phase-locked loop, and after the locking period of the phase-locked loop, generates a modulation voltage obtained by changing the second voltage by a third voltage in accordance with input data, the second voltage being applied to the second control terminal,
   wherein the second voltage is given by a fourth voltage whose temperature dependency is lower than temperature dependency of a potential difference between two terminals of an element which provides a capacitance value in the second voltage-variable capacitive circuit.

10. An apparatus according to claim 9, wherein the third voltage is given by a sum of a fifth voltage proportional to the second voltage and a sixth voltage proportional to the potential difference between the two terminals of the element which provides the capacitance value in the second voltage-variable capacitive circuit.

11. An apparatus according to claim 9, wherein the voltage generation circuit comprises a low-pass filter having a band gap reference circuit, and a wave-shaping circuit which generates the second voltage by giving positive temperature dependency to a reference voltage output from the band gap reference circuit, increases or decreases the second voltage by the third voltage in accordance with the input data, and outputs the second voltage.

12. An apparatus according to claim 9, wherein the first voltage includes a voltage which sets a channel frequency, and the second voltage includes a voltage which has positive temperature dependency and increases or decreases by the third voltage in accordance with the input data.

13. A direct frequency modulation apparatus comprising:
a voltage-controlled oscillator whose oscillation frequency changes on the basis of voltages applied to first and second control terminals, the voltage-controlled oscillator comprising
first and second voltage-variable capacitive elements having first terminals commonly connected to the first control terminal,
third and fourth voltage-variable capacitive elements having first terminals commonly connected to the second control terminal,
a first capacitor having one electrode connected to a second terminal of the third voltage-variable capacitive element and the other electrode connected to a second terminal of the first voltage-variable capacitive element,
a second capacitor having one electrode connected to a second terminal of the fourth voltage-variable capacitive element and the other electrode connected to a second terminal of the second voltage-variable capacitive element,
an inductor which is connected between the second terminals of the first and second voltage-variable capacitive elements;
a first control circuit that controls potentials at said one electrode of the first capacitor and the second terminal of the third voltage-variable capacitive element;
a second control circuit that controls potentials at said one electrode of the second capacitor and the second terminal of the fourth voltage-variable capacitive element; and
a bias circuit that applies a bias voltage to the first and second control circuits,
wherein a temperature dependency of a potential difference between a voltage which is applied from the second control circuit to said one electrode of the second capacitor and the second terminal of the fourth voltage-variable capacitive element and the bias voltage output from the bias circuit is approximate to a temperature dependency of a potential difference between the first and second terminals of the third voltage-variable capacitive element and is approximate to a temperature dependency of a potential difference between the first and second terminals of the fourth voltage-variable capacitive element.

14. An apparatus according to claim 13, wherein the third and fourth voltage-variable capacitive elements have a voltage-current characteristic, and the bias voltage output from the bias circuit is generated from a voltage generated when a predetermined current is supplied to the third and fourth voltage-variable capacitive elements.

15. A direct frequency modulation apparatus comprising:
a voltage-controlled oscillator whose oscillation frequency changes on the basis of voltages applied to first and second control terminals, the voltage-controlled oscillator comprising
at least one inductor,
first and second voltage-variable capacitive elements having first terminals commonly connected to the first control terminal,
third and fourth voltage-variable capacitive elements having first terminals commonly connected to the second control terminal,
a first capacitor having one electrode connected to a second terminal of the first voltage-variable capacitive element and the other electrode connected to a first terminal of the inductor,
a second capacitor having one electrode connected to a second terminal of the second voltage-variable capacitive element and the other electrode connected to a second terminal of the inductor,
a third capacitor having one electrode connected to a second terminal of the third voltage-variable capacitive element and the other electrode connected to the first terminal of the inductor,
a fourth capacitor having one electrode connected to a second terminal of the fourth voltage-variable capacitive element and the other electrode connected to the second terminal of the inductor;
a first control circuit which controls potentials at said one electrode of the first capacitor and the second terminal of the first voltage-variable capacitive element;
a second control circuit which controls potentials at said one electrode of the second capacitor and the second terminal of the second voltage-variable capacitive element;
a third control circuit which controls potentials at said one electrode of the third capacitor and the second terminal of the third voltage-variable capacitive element;
a fourth control circuit which controls potentials at said one electrode of the fourth capacitor and the second terminal of the fourth voltage-variable capacitive element; and
a bias circuit that applies a bias voltage to the first to fourth control circuits, wherein a temperature dependency of a potential difference between a voltage which is applied from the third control circuit to said one electrode of the third capacitor and the second terminal of the third voltage-variable capacitive element and the bias voltage output from the bias circuit is approximate to a temperature dependency of a potential difference between the first and second terminals of the third voltage-variable capacitive element and is approximate to a temperature dependency of a potential difference of the fourth voltage-variable capacitive element.

16. An apparatus according to claim 15, wherein the third and fourth voltage-variable capacitive elements have a voltage-current characteristic, and the bias voltage output from the bias circuit is generated from a voltage generated when a predetermined current is supplied to the third and fourth voltage-variable capacitive elements.

* * * * *